(12) United States Patent
Borzenets et al.

(10) Patent No.: US 6,791,430 B2
(45) Date of Patent: Sep. 14, 2004

(54) RESONATOR TUNING ASSEMBLY AND METHOD

(75) Inventors: Valery Borzenets, San Jose, CA (US); Stuart Jay Berkowitz, San Francisco, CA (US); Philip E. Blumenfeld, Morgan Hill, CA (US); Nikolai Maltsev, San Jose, CA (US)

(73) Assignee: Conductus, Inc., Sunnyvale, CA (US)

( * ) Notice: Subject to any disclaimer, the term of this patent is extended or adjusted under 35 U.S.C. 154(b) by 0 days.

(21) Appl. No.: 10/037,292

(22) Filed: Dec. 31, 2001

(65) Prior Publication Data

US 2003/0122635 A1 Jul. 3, 2003

(51) Int. Cl.[7] .............................. H03J 7/02; H03J 1/00; H03J 3/22; H03H 7/01
(52) U.S. Cl. ..................... 333/17.1; 333/995; 333/174; 333/235; 505/210; 505/700; 505/866
(58) Field of Search ................................ 333/995, 17.1, 333/174, 205, 235; 505/210, 700, 866

(56) References Cited

U.S. PATENT DOCUMENTS

| | | | |
|---|---|---|---|
| 4,996,188 A | | 2/1991 | Kommrusch .................. 505/1 |
| 5,391,543 A | * | 2/1995 | Higaki et al. ................ 505/210 |
| 5,523,699 A | * | 6/1996 | Miyagawa .................. 324/765 |
| 5,616,538 A | * | 4/1997 | Hey-Shipton et al. ....... 505/210 |
| 5,677,653 A | | 10/1997 | Särkkä ........................ 333/235 |
| 5,739,731 A | * | 4/1998 | Hicks et al. ................ 333/17.1 |
| 5,888,942 A | * | 3/1999 | Matthaei .................... 505/210 |
| 5,949,302 A | | 9/1999 | Särkka ........................ 333/126 |
| 5,968,876 A | | 10/1999 | Sochor ........................ 505/210 |
| 6,085,605 A | | 7/2000 | Koivisto .................... 74/89.15 |
| 6,147,577 A | | 11/2000 | Cavey ........................ 333/209 |
| 6,347,237 B1 | * | 2/2002 | Eden et al. ................. 505/210 |
| 6,438,394 B1 | * | 8/2002 | Zhang et al. ............... 505/210 |
| 6,522,217 B1 | * | 2/2003 | Shen .......................... 333/995 |

FOREIGN PATENT DOCUMENTS

| | | | | |
|---|---|---|---|---|
| DE | 41 22 697 A1 | | 1/1992 | |
| EP | 1 202 375 A2 | | 5/2002 | |
| JP | 1-170102 | * | 7/1989 | ............. 333/219.1 |
| JP | 2001-211004 | * | 8/2001 | |
| WO | WO 90/06627 | | 6/1990 | |
| WO | WO 01/08250 A1 | | 2/2001 | |

* cited by examiner

*Primary Examiner*—Barbara Summons
(74) *Attorney, Agent, or Firm*—Merchant & Gould P.C.

(57) ABSTRACT

A device and method for tuning a planar filter through a wide range of center frequencies are disclosed. The tuning assembly includes a superconductive tuning tip and an actuator configured and adapted to move the tuning tip through a sufficient range of distances from a resonator or a portion thereof to vary the resonant frequency of the resonator by at least about 10% of the untuned frequency in at least one increment of 0.01% or smaller. An actuator and a position-sensor can be employed in a closed loop feedback system to control the position of the tuning tips. The present invention also provides a method of tuning a filter that includes moving a tuning tip through a sufficient range of distances from a resonator to vary the resonant frequency of the resonator by at least about 10% in at least one increment of 0.01% or smaller.

27 Claims, 28 Drawing Sheets

RESONATOR TUNING ASSEMBLY AND METHOD

STATEMENT OF GOVERNMENT INTEREST

This invention was made with United States Government support under award No. MDA 972-00-C-0030 awarded by the Department of Defense and cooperative agreement number 70NANBOH3032 awarded by the National Institute of Standards and Technology (NIST). The United States Government has certain rights in the invention.

FIELD OF THE INVENTION

The present invention relates generally to tuning of electronic filters and more particularly to a device and method for mechanically tuning a filter over a wide range of frequencies using one or more tuning pin.

BACKGROUND OF THE INVENTION

Electronic filters are extensively used in a variety of applications, including wireless communication. Modern wireless communication systems impose stringent requirements on filter performance. Escalating demand for communication channels dictates more efficient use of allocated spectral slots. Increasingly, applications require very narrow-band bandpass filters (as narrow as 0.05% bandwidth) with precise center frequencies and high signal throughput within the bandwidth, as well as bandstop filters with precise center frequencies and high rejection. In either case, the filter response curve must have sharp skirts so that a maximum amount of the available bandwidth may be utilized without unacceptable levels of cross-talk. The filters must also have high quality factors, or Q-factors, (for example, 5,000 or higher) to minimize signal loss.

Various tuning means have been used to achieve precise filter center frequencies. For example, U.S. Pat. No. 5,968,876, which is assigned to Conductus, Inc., discloses tuning the resonant frequency of a resonator using a spring-loaded tuning pin having a superconducting, dielectric or magnetic tuning tip. The resonant frequency is adjusted by adjusting the distance between the tuning tip and the resonator. Such tuning mechanisms have typically been used to maintain center frequencies of filters but not substantially changing the center frequencies because the range of center frequencies that is achievable by a filter while maintaining other performance parameters is typically very small. For example, for a tuning device of the type disclosed in the U.S. Pat. No. 5,968,876, the tuning tip typically is not designed to travel closer to the resonator than about 0.5 mm. The tuning range is typically a few megahertz for center frequencies of the order of 850 MHz to 1.9 GHz.

The invention disclosed herein makes possible wide range tuning of filters to suit a broad range of applications.

SUMMARY OF THE INVENTION

Generally, the invention provides a tuning assembly and method for mechanically tuning planar resonators and filters over a wide range of frequencies with precision while maintaining the performance of the resonators and filters.

According to one aspect of the invention, the tuning assembly includes a tuning tip and an actuator configured and adapted to move the tuning tip through a sufficient range of distances from a resonator or a portion thereof to vary the resonant frequency of the resonator by at least about 10% of the untuned frequency in at least one increment of 0.01% or smaller.

According to another aspect of the invention, an actuator and a position sensing device are employed in a closed loop feedback system to control the position of the tuning tips.

According to another aspect of the invention, a method of tuning a filter includes moving a tuning tip through a sufficient range of distances from a resonator to vary the resonant frequency of the resonator by at least about 10% in at least one increment of 0.01% or smaller.

BRIEF DESCRIPTION OF THE DRAWINGS

Other objects and advantages of the invention will become apparent upon reading the following detailed description and upon reference to the drawings in which:

FIG. 15b is a exploded view of the components of the tuning assembly shown in FIG. 15a;

Figure 1:
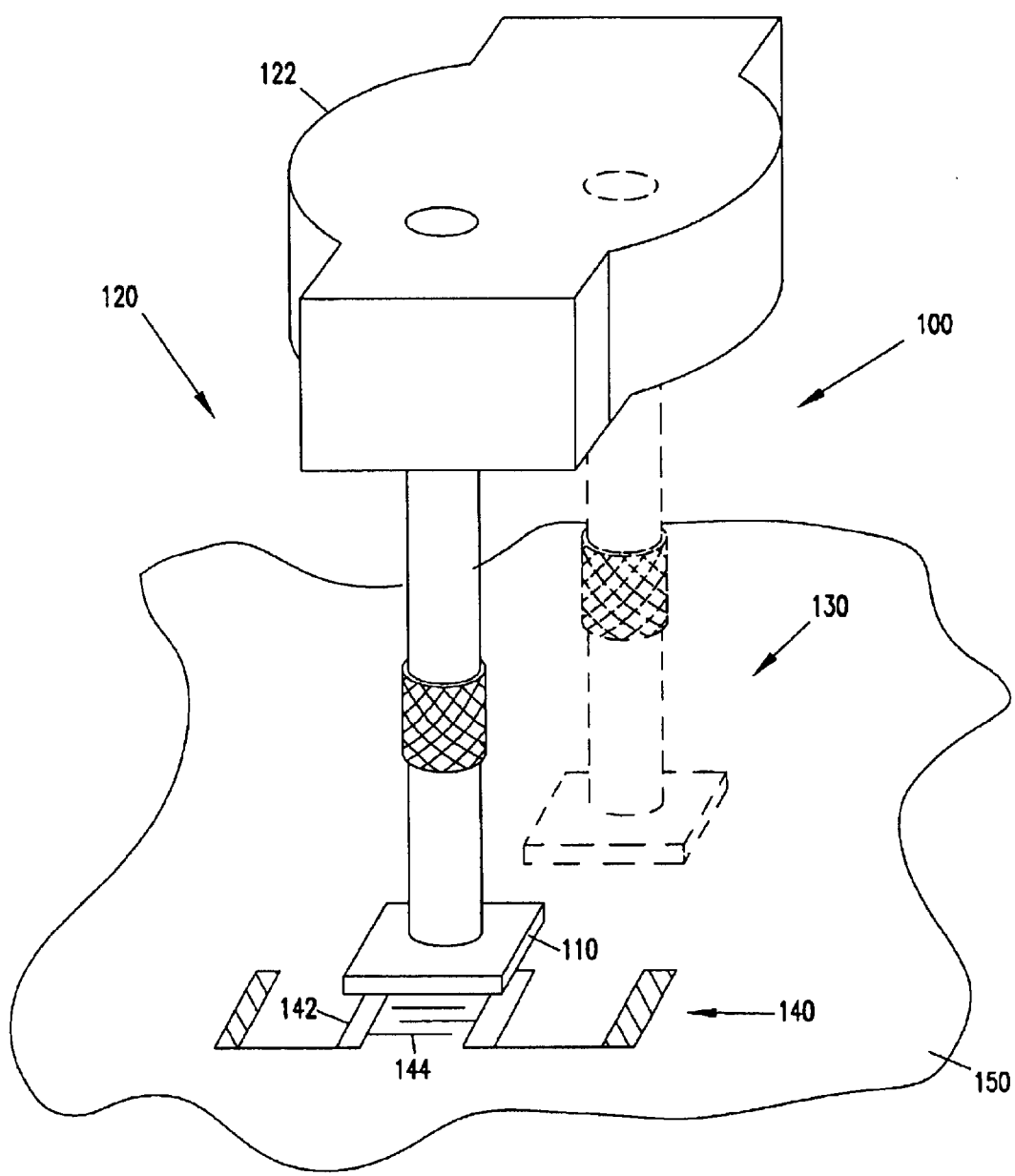
FIG. 1 schematically shows an embodiment of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The embodiments of the invention described herein are for filters and resonators in a microstrip configuration. In a microstrip configuration, a dielectric substrate has a ground-plane comprising a conductive or superconductive material deposited on one surface. The opposite surface is patterned with one or more resonators, each resonator comprising inductive and capacitive elements. The resonators may be of a variety of types, including distributed form, such as hairpin resonators and lumped element type resonators. It may also be practiced with a resonator having a frequency-dependent component such a half-loop inductor with an interdigital capacitor in parallel to and positioned within the loop pf the inductor. The invention can also be practiced with other planar filter configurations. Generally according to the invention, the tuning assembly includes a superconductive tuning tip, which may be a superconductive film deposited on a substrate, and an actuator operatively connected to the tuning tip. Alternatively, the tip can be formed of a bulk superconductor. The actuator is configured to move the tuning tip through a range of distances from a resonator. The range is sufficiently large to enable the resonant frequency of the resonator to change by at least 10%. The tuning tip is sized and shaped to ensure that the performance (for example, Q) of the resonator is substantially maintained throughout the range of resonant frequencies. The actuator can additionally be configured to move the tuning tip through the range of distances from the resonator in sufficiently small steps such that the resonant frequency changes by 0.01% or less with each step.

Using the tuning assembly according to the invention, the center frequency of a filter can be varied by at least 10% while the performance of the filter is substantially maintained. In one of the preferred embodiments, a superconductive tuning tip is positioned with precision to within 250 nm from the resonator.

The general features of a tuning assembly according to one aspect of the invention are schematically illustrated in FIG. 1. The tuning assembly 100 includes a tuning tip 110. The tuning tip 110 is supported on and movable by an actuator 120. The actuator 120 includes a driver 122 and a moving arm 124 connected to the driver 122. The tuning tip 110 is attached to the moving arm 124.

The tuning assembly 100 is configured to position tuning tips 110 over at least a portion of a filter circuit, which may include several resonators 140 (only one shown in FIG. 1). For example, a resonator 140 can be a half-loop inductor 142 with an interdigitized capacitor 144 inside. The resonator can be formed by a superconductor patterned on top of a dielectric substrate 150. The tuning assembly 100 includes at least one, but typically more, tuning tips 110. Each tuning tip 110 can be independently moved toward or away from its respective actuator.

For tuning center frequency over a wide range, the tuning tip 110 is made of a superconductive material. For example, it can be a thin film of oxide superconductor, such as yttrium-barium copper oxide (YBCO), deposited on a dielectric substrate, such as magnesium oxide, sapphire or lanthanum aluminate. It can also be in bulk, such as a rod or disk of YBCO or another superconductor. The inventors have discovered that a superconductive tuning tip produces a much wider tunable range than a dielectric tip in an otherwise identical tuning assembly. However, as described in more detail below, a dielectric tuning tip can be used in combination with a superconductor tip to achieve precise tuning over a wide range of frequencies.

The driver 122 can be a variety of devices that are capable of moving the moving arm 124. The driver 122 can further be an electrical signal-controlled device. For example, the driver 122 can be a stepper motor, which can be controlled by a computer. Other devices, such as linear servomotors and piezoelectric actuators, can also be used.

Where needed, gears can be used to produce linear motion of the tuning tip. For example, a worn gear can be used to advance or retract the moving arm 124 and the tuning tip 110.

Each tuning tip 110 is configured to be positioned over at least a portion of a resonator 140, for example a combination of half loop 142 and interdigitized capacitor 144. When the tuning tip is sufficiently close to the resonator 140, the resonant frequency of the resonator 140 is influenced by the tuning tip. The resonant frequency of the resonator 140 thus varies with the distance between the tuning tip and the resonator 140. The actuator has sufficient range to move the tuning tip to vary the resonant frequency of the resonator 140 by at least about 3% for example, 3%, 5% and 10%. The inventors have discovered that by moving a superconductive tuning tip to very small distances, e.g., within in about 250 nm, from the resonator, one can achieve such wide-range tuning without significantly lowering the Q-factor of the resonator. Tuning ranges of as much as 50% have been achieved, and much larger ranges should be achievable.

The actuator also has enough precision so that the resonant frequency of a resonator 140 can be changed by the movement of the tuning tip in increments of less than 0.01% of the resonant frequency. For example, with a Picomotor 8321-V actuator (available from New Focus, Inc., San Jose, Calif.), the minimum step is <30 nm, corresponding to a frequency increment smaller than 10 kHz near 900 MHz. Other devices and methods can also be employed, as set forth in more detail below, to achieve precision tuning.

Figure 19:
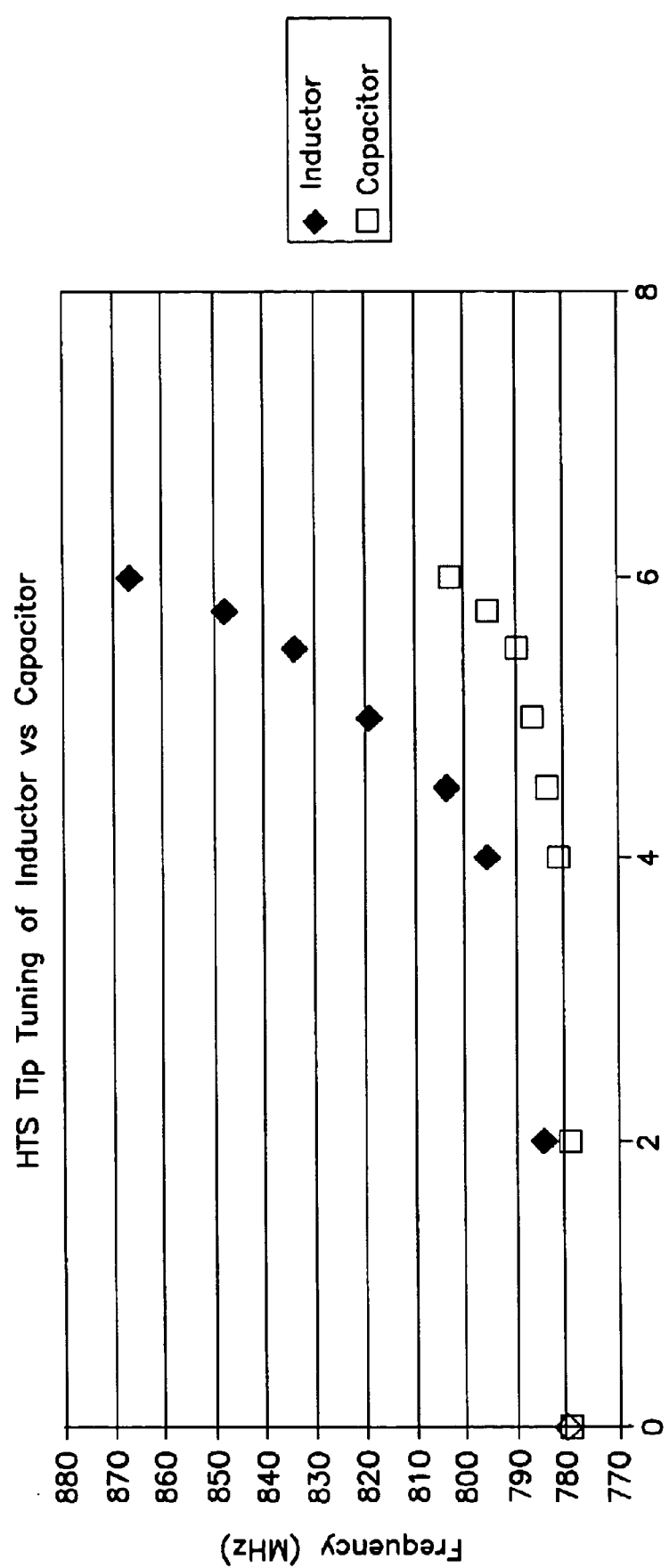
FIG. 19 schematically shows the tuning ranges achieved by positioning the tuning tip above the half-loop inductor and the interdigital capacitor, respectively, in the filter circuits of the types shown in FIGS. 18a and 18b.

The tuning tip is preferably positioned over the portion of the resonator having the highest current density. Generally, this requires positioning the tuning tip over the inductor. As shown in FIG. 19, a larger change in the center frequency for each increment of movement toward the resonator is obtained if the superconductive tuning tip is positioned over the inductor rather than over a capacitor.

The tuning tip is shaped and sized to maintain the Q-factor of the resonator 140 throughout the intended range of resonant frequencies. It is believed that the deterioration of Q-factor is primarily caused by radiation energy loss through fringe fields. To maintain the Q-factor throughout the tuning range, it is thus advantageous to have a tuning tip that is at least approximately the same size as the size of the inductor 142. Other considerations may limit the desirable size of the tuning tip 110. For example, the size of tuning tip 110 typically should not be considerably larger than that of the resonator 140 or the tuning tip would significantly overlap, and interfere with the operation of, the devices neighboring the resonator 140. Thus, it is typically desirable to have a tuning tip that is approximately the same size and shape as the footprint of the inductor under the tuning tip. For example, for a resonator that includes a square-shaped half loop with an interdigitized capacitor inside, it is typically desirable to have square-shaped tuning tip that is approximately the same size as the half loop.

In operation, the actuator 120 advances the tuning tip 110 toward, or retracts the tuning tip 110 from, the resonator 140, thereby changing the resonant frequency of the resonator. In case of a multi-pole filter, individual resonators can be tuned collectively to change the characteristic frequency of the filter. The Q-factor of the filter is maintained at about 10,000 or higher throughout the range of frequency change.

Figure 2:
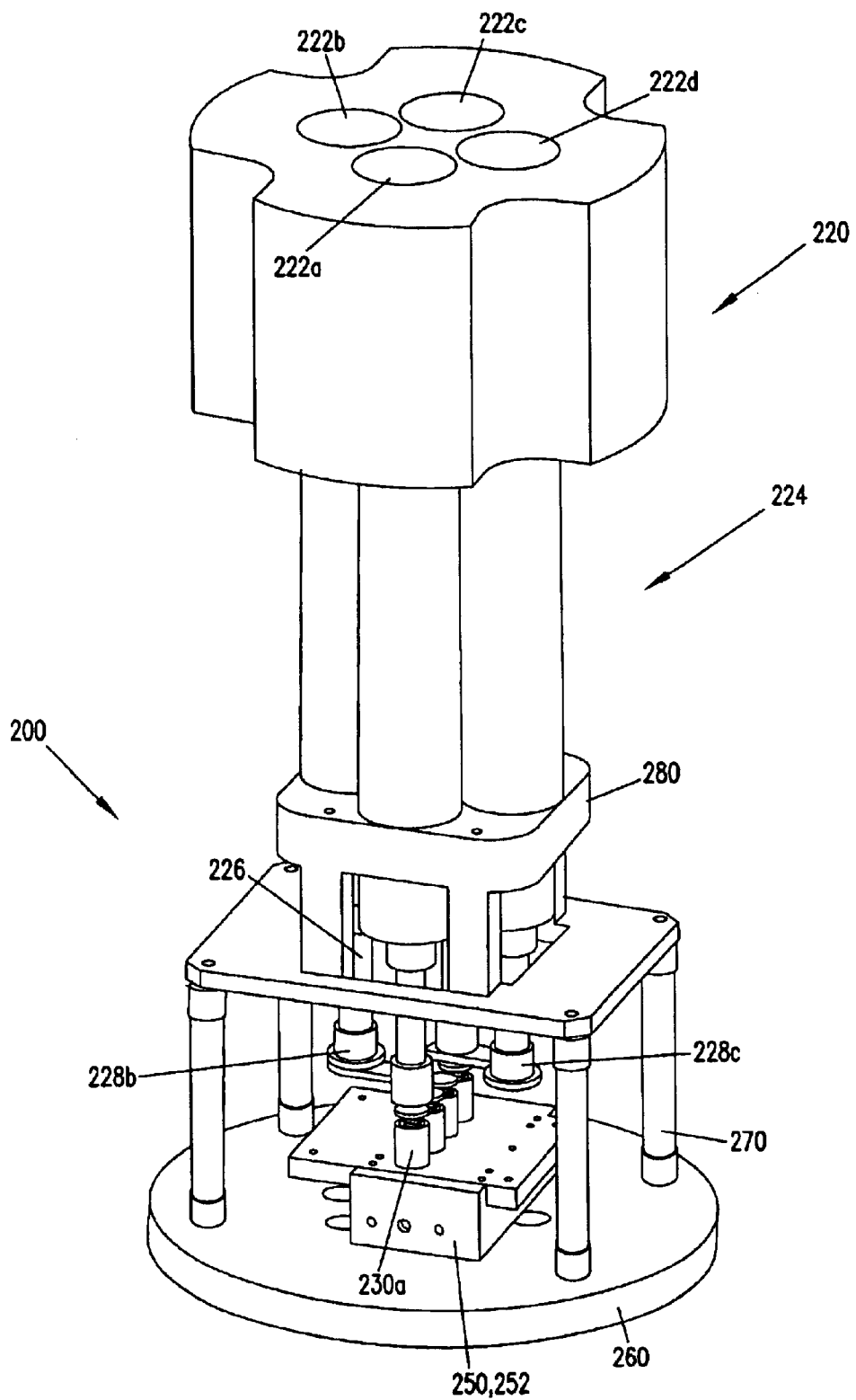
FIG. 2 schematically shows another embodiment of the invention.
Figure 3:
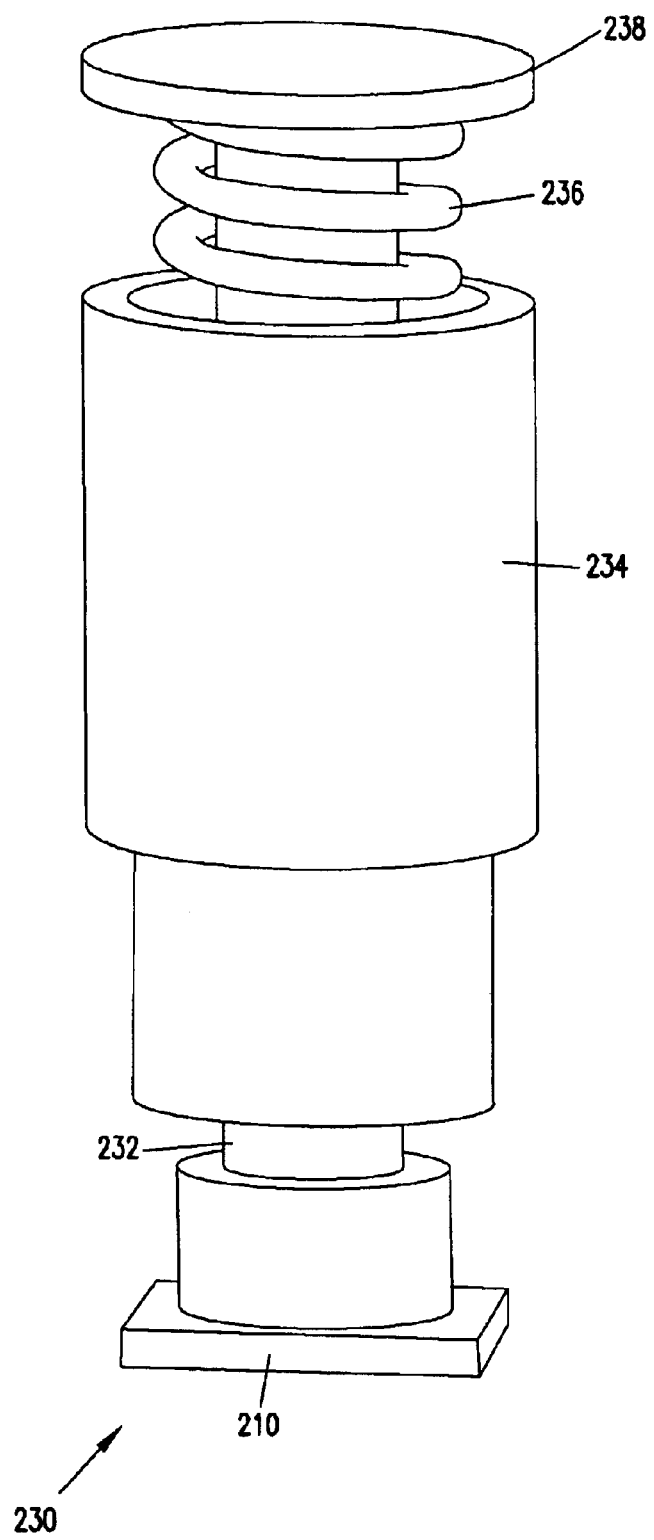
FIG. 3 schematically shows the details of a section of the actuator in FIG. 2.

In an illustrative embodiment of the invention, schematically illustrated in FIGS. 2 and 3, a tuning assembly 200 for a filter 250 having four resonators includes a tuning sub-assembly for each resonator. The tuning assembly 200 and filter 250 are rigidly mounted together in a vacuum vessel (not shown). Each sub-assembly includes a tuning tip 210 and an actuator 220. Each actuator 220 is one of the four servomotors in a vacuum-compatible direct current micrometer servomotor package (Model number M-227.25, available from Polytec PI). The servomotor package also includes a four-channel control board (not shown) for interfacing the servomotors to a computer, which controls the movement of the motor shafts 222. Each servomotor 220 can move the shaft 222 (one of 222a–222d) over a distance of about 2.5 mm with an accuracy of 60 nm.

Each shaft 222, which is non-rotating, makes up part of the moving arm 224. The remainder of the moving arm 224 includes a thermal isolator 226 attached to the shaft 222, a sliding pin pushing pad 228 and a sliding pin assembly 230 (one of 230a–230d).

Referring more specifically to FIG. 3, the sliding pin assembly 230 includes a sliding pin 232, a bushing 234 and a biasing spring 236. The sliding pin 232 is attached to the tuning pin 210 at one end and forms a flange 238 at the other. The bushing 234 holds the sliding pin 232 and substantially confines the movement of the sliding pin 232 to sliding along their common axis. The biasing spring 236 is positioned between a recess in the bushing 234 and the flange 238 and biases the tuning tip 210 away from the resonator when the tuning assembly 200 is mounted over the filter to be tuned.

The components of the sliding pin assembly 230 can be made of any suitable material. For operating at cryogenic temperatures, i.e., those at which superconductor filters and tuning tips are designed to operate (for example, 60–70K for certain oxide superconductors), the components are made from materials that allow the components to perform their intended functions at those temperatures. For example, the spring 238 and bushing 234 can be made of a beryllium-copper alloy, or other materials maintains sufficient resiliency at cryogenic temperatures. The sliding pin can be made of stainless steel, barium-copper alloys and other suitable materials.

Figure 4:
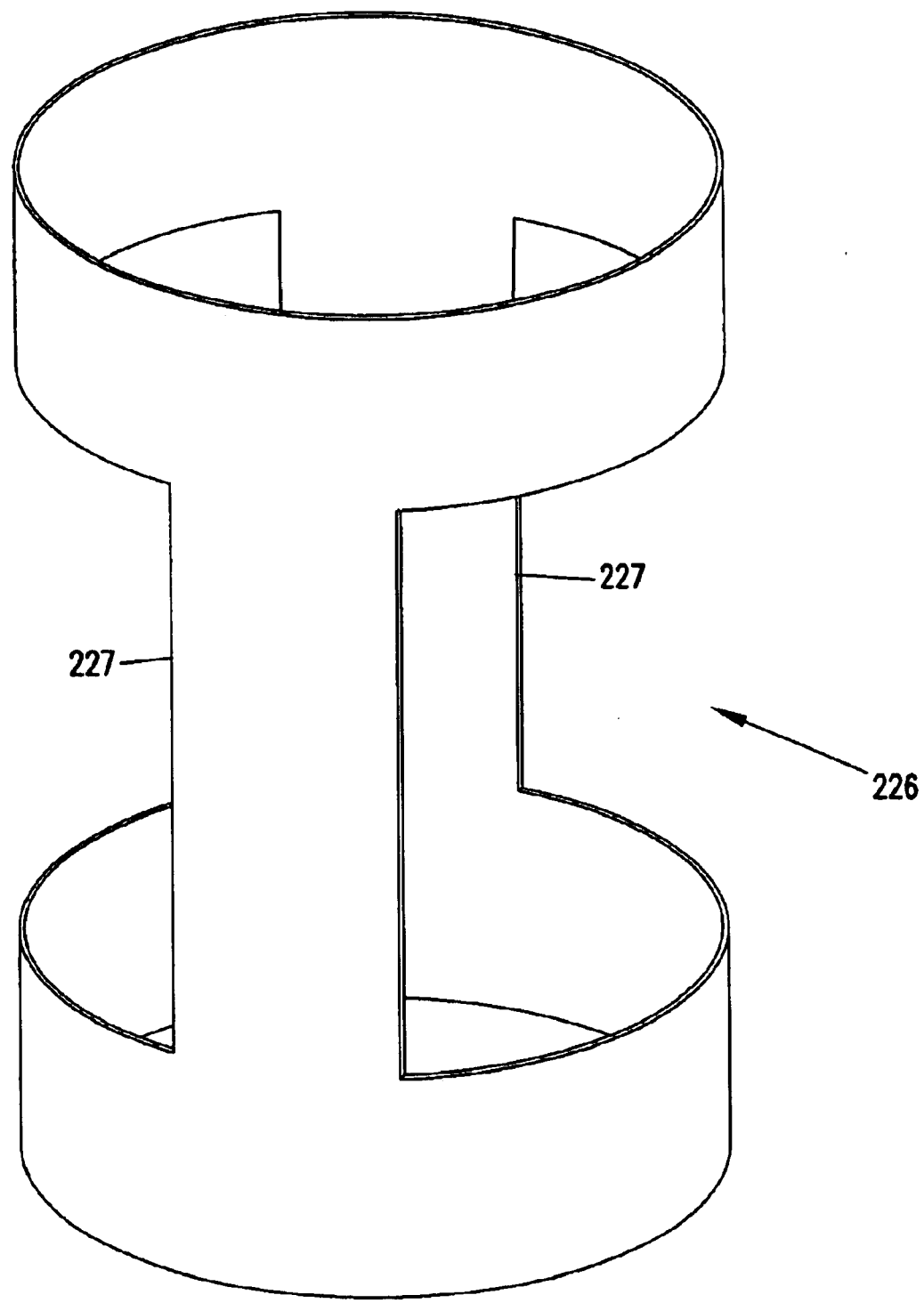
FIG. 4 schematically shows the details of the thermal isolator used in the actuator in FIG. 2.

Referring again to FIG. 2, and in more detail to FIG. 4, the thermal isolator 226 is designed to allow the tuning tips 210 to operate at cryogenic temperatures while allowing the servomotors to operate at non-cryogenic temperatures. The thermal isolator 226 in the illustrative embodiment is a stainless tube with most of the walls cut out. The remaining narrow strips 227 of stainless steels provide the needed structural integrity of the moving arm 224 and high thermal resistance along the moving arm 224. Other materials and shapes for the thermal isolator can also be used.

The sliding pin pushing pads 228 is made of stainless steel in the illustrative embodiment but may be made of any material that is suitable for cryogenic temperatures. Each pushing pad extends between the thermal isolator 226 and the sliding pin assembly 230 and accommodates any misalignment between the two. For example, in the illustrative embodiment shown in FIG. 2, the sliding pins assemblies 230a–d are arranged in a linear array whereas the servomotor shafts are bundled in a 2×2 square matrix. Thus, some push pads (e.g., 228b and 228c) extend laterally to connect between the thermal isolators 226b, 226c and the sliding pin assemblies 230b, 230c, respectively.

The tuning assembly 200 is mounted over the filter 250 in the following manner in the illustrative embodiment: The filter 250 is encased in a brass shield 252, which is mounted on a cold plate 260 made of brass. Beryllium-copper shield and cold plate can also be used. An insulating frame 270 made of an insulator such as an epoxy impregnated fiber-glass material (G10, available from numerous sources) is also mounted on the cold plate 260. The tuning assembly 200 is mounted on a brass frame 280, which is, in turn, mounted on the insulating frame 270. The moving arms 224 extend through the brass 280 and insulating frames 270 toward the filter 250. The bushings 234 of the sliding pin assemblies are mounted on the shield 252 through the respective openings on the shield 252. The sliding pins 232 extend through the bushings 234 and the openings on shield 252. The tuning tips 210 are thus positioned above the resonators of the filter 250.

In operation, the filter 250 and tuning tips 210 are cooled to cryogenic temperatures by a cryocooler via the cold plate 260 and shield 252. As a servomotor drives its shaft toward the resonator, the corresponding sliding pin 232 and therefore the tuning tip 210 are pushed toward the resonator against the bias of the biasing spring 236. As the a servomotor drives its shaft away from the resonator, the corresponding biasing spring 236 expands and retracts the sliding pin 232 and tuning tip 210 from the resonator.

A tuning assembly of the type illustrated in FIGS. 2, 3 and 4 was used to vary the resonant frequencies of the resonators in a four-pole notch filter 500 schematically shown in FIG.

5. The filter 500 was made of YBCO patterned on a lanthanum aluminate substrate. The size of the half-loop inductors 510 was approximately 3 mm×3.4 mm. Each YBCO tuning tip, which was a square approximately 5 mm in size, was positioned face-to-face above a combination of half-loop inductor 510 and interdigitized capacitor 520.

The servomotors were controlled by a computer programmed to be interfaced with the control board of the servomotor package and to store the servomotor positions for different positions in a look-up table. The look-up table enables easy switching of resonator frequencies by simply recalling the stored tuning parameters. Alternatively, the parameters of a best-fit curve from a calibration run can be stored and later used to calculate the needed tuning parameters.

Figure 5:
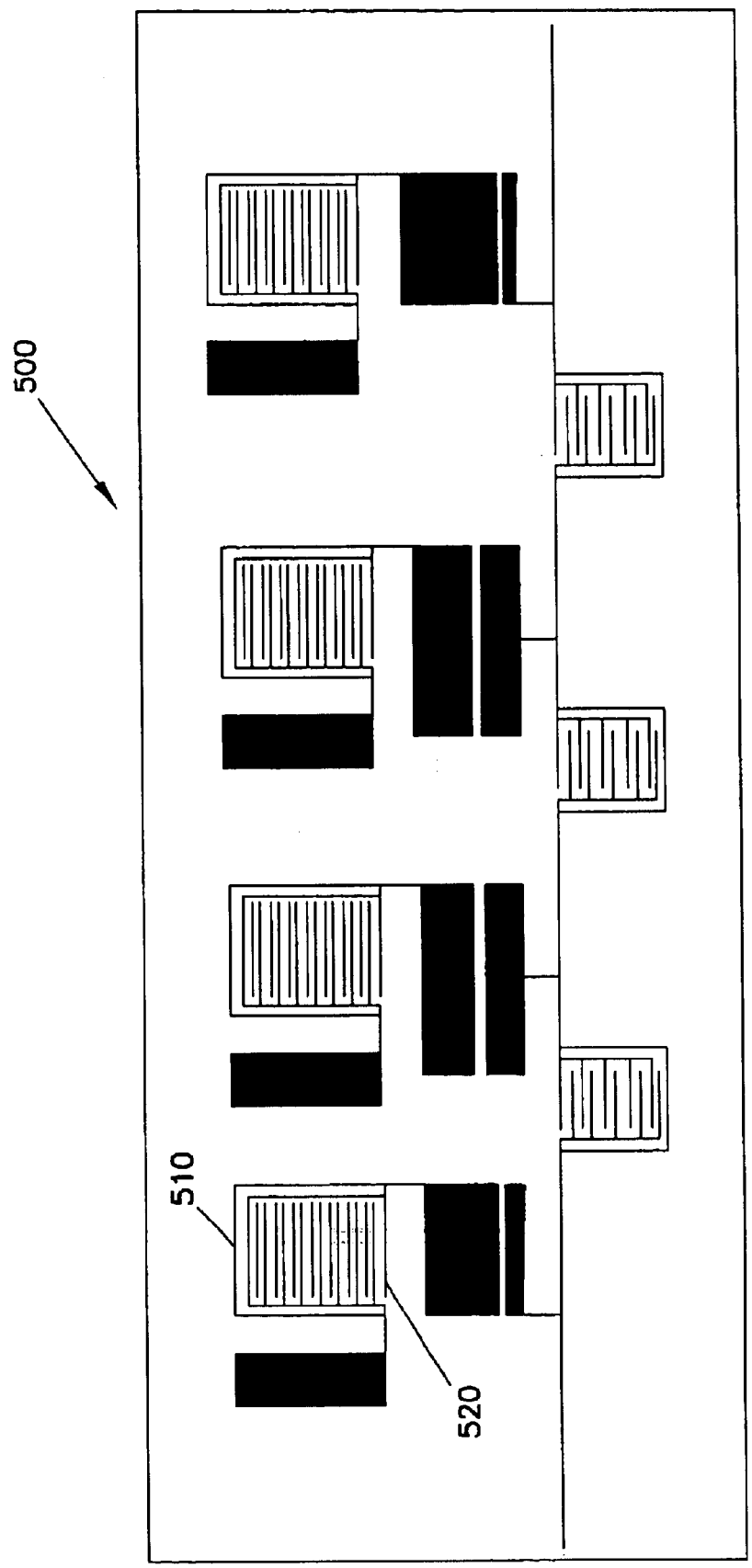
FIG. 5 schematically shows a four-pole notch filter, for which the result of tuning of individual resonators of the filter is shown in FIG. 6.
Figure 6:
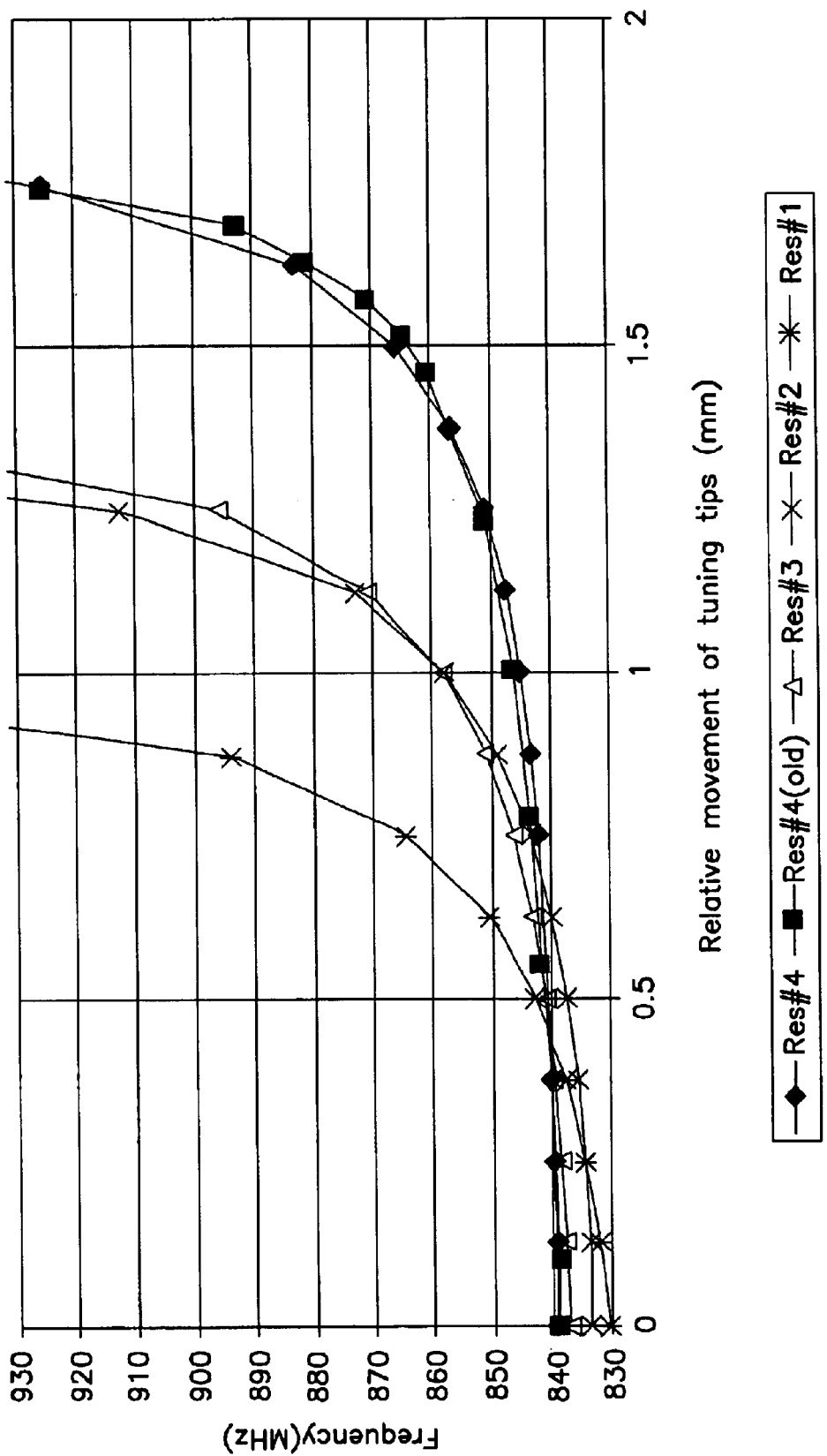
FIG. 6 schematically shows the resonant frequencies as functions of the tuning tip movement for the resonators in the notch filter shown in FIG. 5.

As shown in the plots of frequency vs. tuning tip motion in FIG. 6, the filter shown in FIG. 5 had an untuned bandwidth (i.e., with the tuning tip sufficiently far away from the resonator so as to have substantially no influence on the resonant frequency of the resonator) of about 10 MHz and a center frequency of about 835 MHz (Relative movement=0). As the tuning tips were moved toward their respective resonators, the resonant frequencies increased. Within the mechanical range of the servomotors (2.5 mm), the resonant frequencies of the resonator could be varied by a factor of 10% or more. For example, by advancing the tuning tip above resonator #1 by about 0.8 mm, #2 by about 1.2 mm, #3 by about 1.7 mm and #4 by about 1.7 mm, the resonant frequencies were tuned to between about 890 and 900 MHz.

Figure 7:
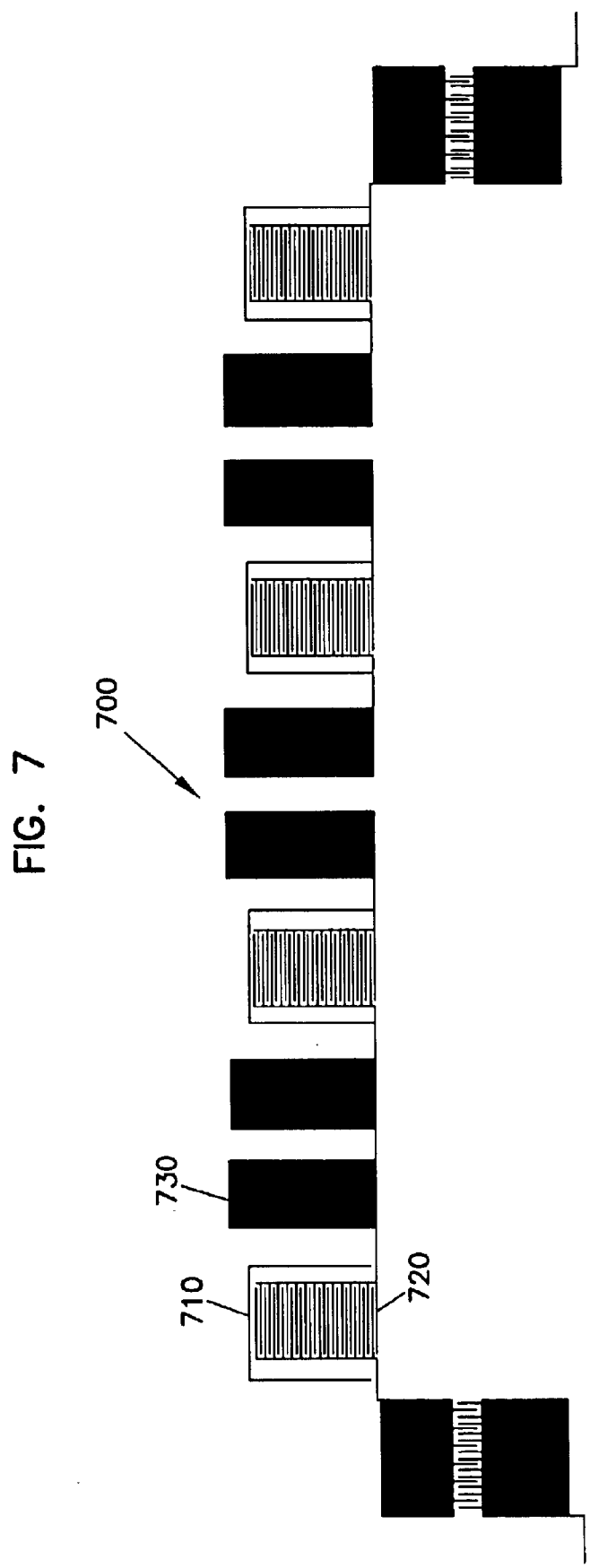
FIG. 7 schematically shows a four-pole bandpass filter, for which the result of tuning of individual resonators of the filter is shown in FIG. 8.
Figure 8:
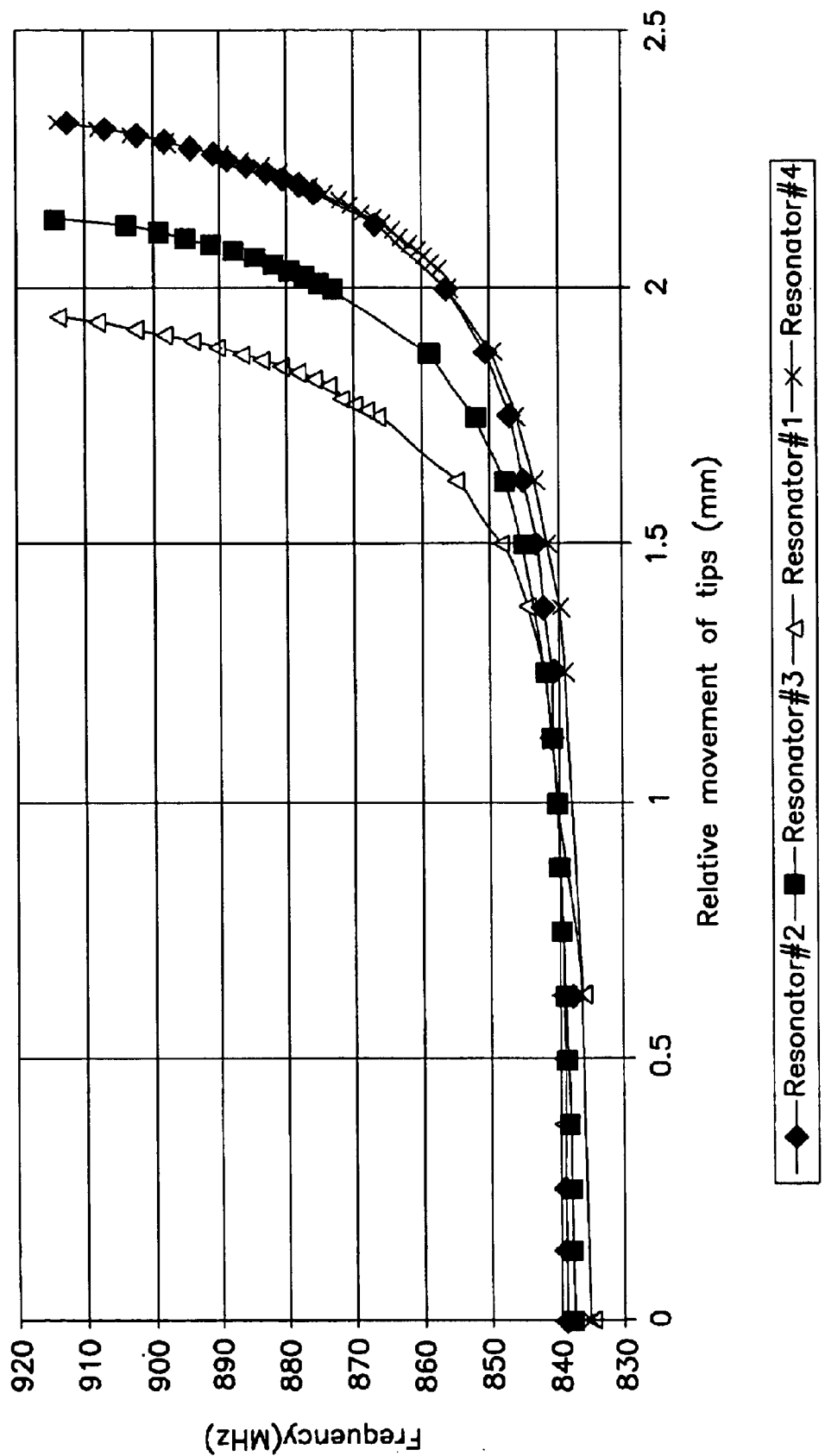
FIG. 8 schematically shows the resonant frequencies as functions of the tuning tip movement for the resonators in the bandpass filter shown in FIG. 7.

A similar set of measurements was carried out on a four-pole bandpass filter 700 schematically shown in FIG. 7. The filter includes four resonators, each comprising a half-loop inductor 710 that encompasses an interdigitized capacitor 720. The filter also includes various capacitive pads 730 for coupling between the resonators and to the ground plane. Again, the resonant frequencies of the untuned resonators were between 830 and 840 MHz. As shown in FIG. 8, the resonant frequencies of the resonators increased with the advancement of the tuning tips toward the resonators. The range of frequency change of up to about 10% was achieved.

Figure 9A:
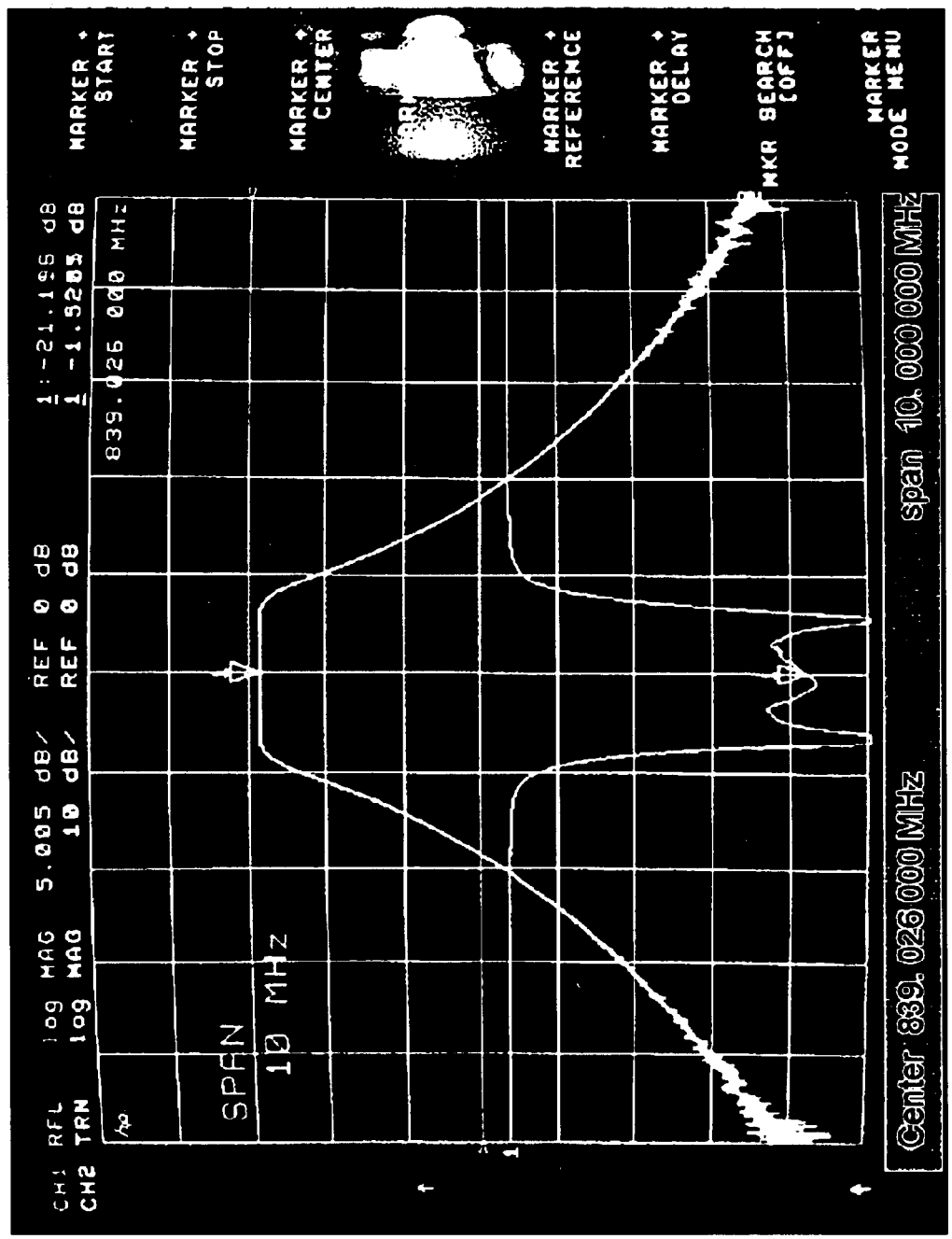
FIG. 9(a) shows the frequency response of the bandpass filter of FIG. 7.
Figure 9B:
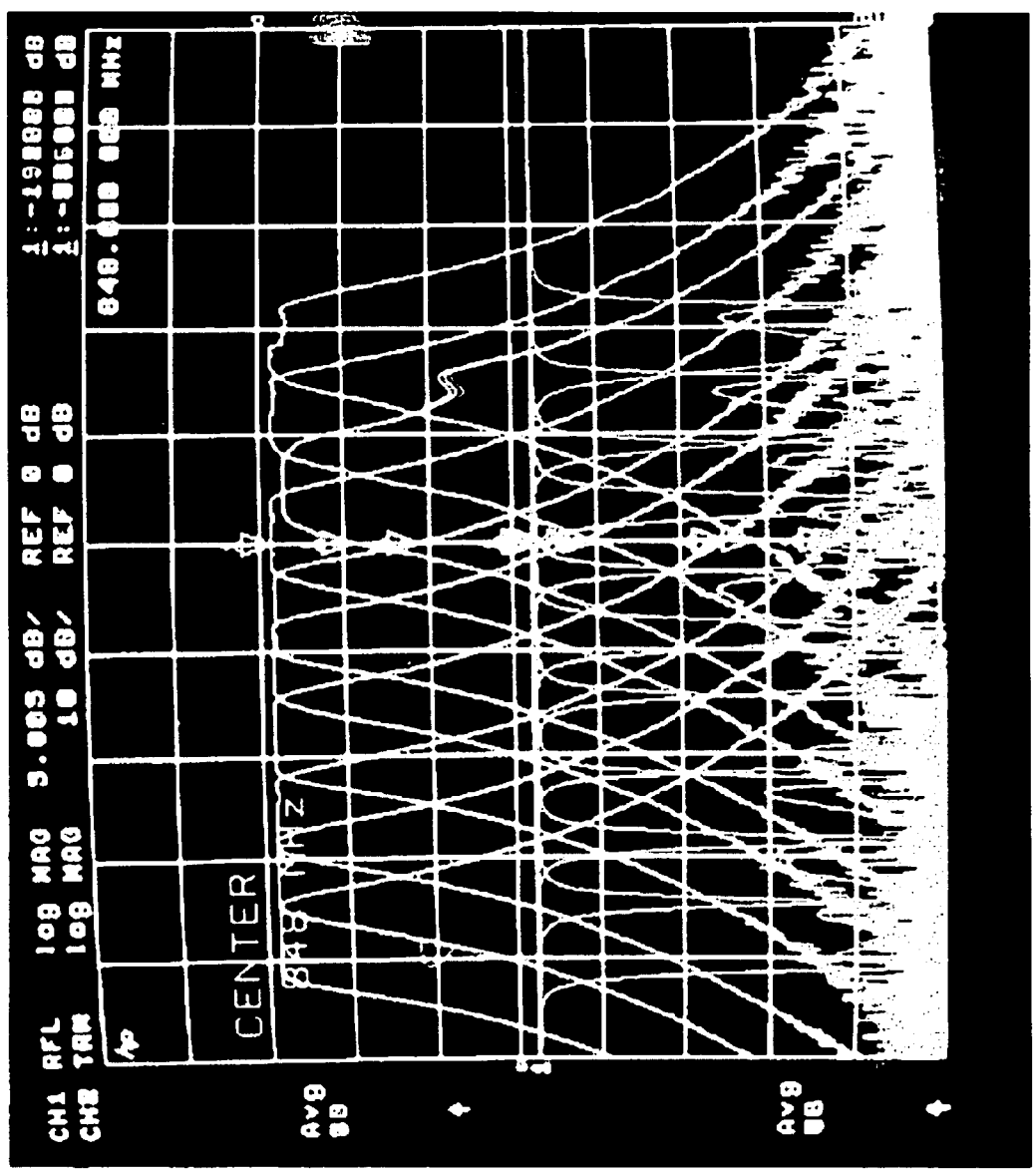
FIG. 9(b) shows the frequency response of the bandpass filter of FIG. 7 with the center frequency of the filter tuned over a range that is ten time the bandwidth of the filter.

The four-pole bandpass filter schematically shown in FIG. 7 was tuned with a tuning assembly of the type shown in the FIGS. 2, 3 and 4 over a range that is ten times the bandwidth of the filter. As shown in FIG. 9(a), the filter has a bandwidth of about 1.3 MHz and was initially centered at about 839 MHz. The filter was then tuned in ten increments to increase its center frequency, each increment being about the bandwidth of the filter, i.e., about 1.3 MHz. The composite plots of frequency response of the filter at ten different center frequencies are shown in FIG. 9(b). The maximum range of frequency shift was about 13 MHz, or about 1.5% of the initial value. It is evident that the initial low return and insertion losses were maintained as the tuning assembly swept through the frequency steps. After each step of increase during the first frequency sweep, the servomotor positions were stored for future use. The center frequency of the filter could subsequently be reliably reproduced by reloading the appropriate servomotor position from the look-up table.

Figure 10A:
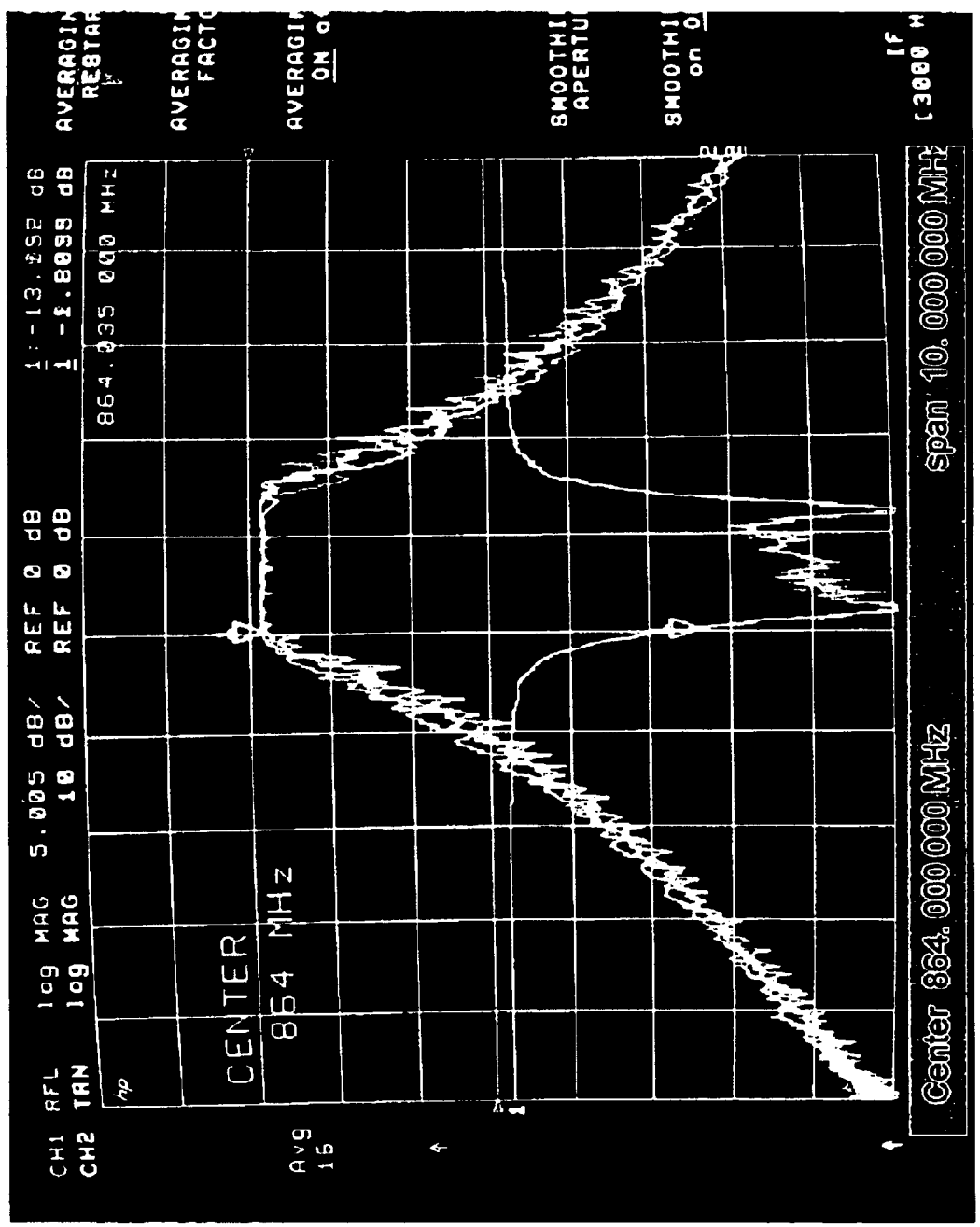
FIG. 10(a) shows the frequency response of the bandpass filter of FIG. 7, with the center frequency of the filter tuned over a 3% range.
Figure 10B:
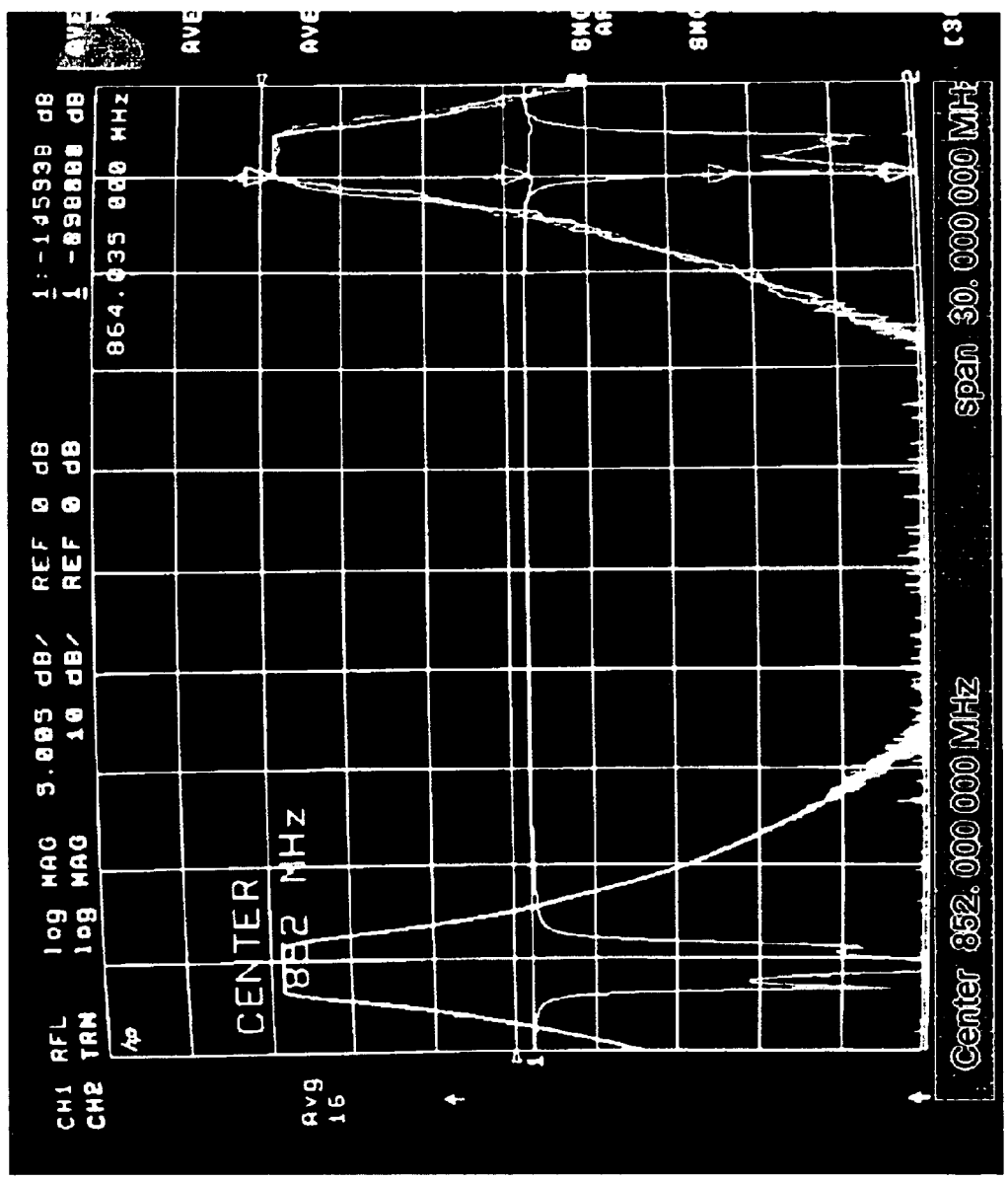
FIG. 10(b) shows in more detail a portion of the frequency response shown in FIG. 10(a)
Figure 11A:
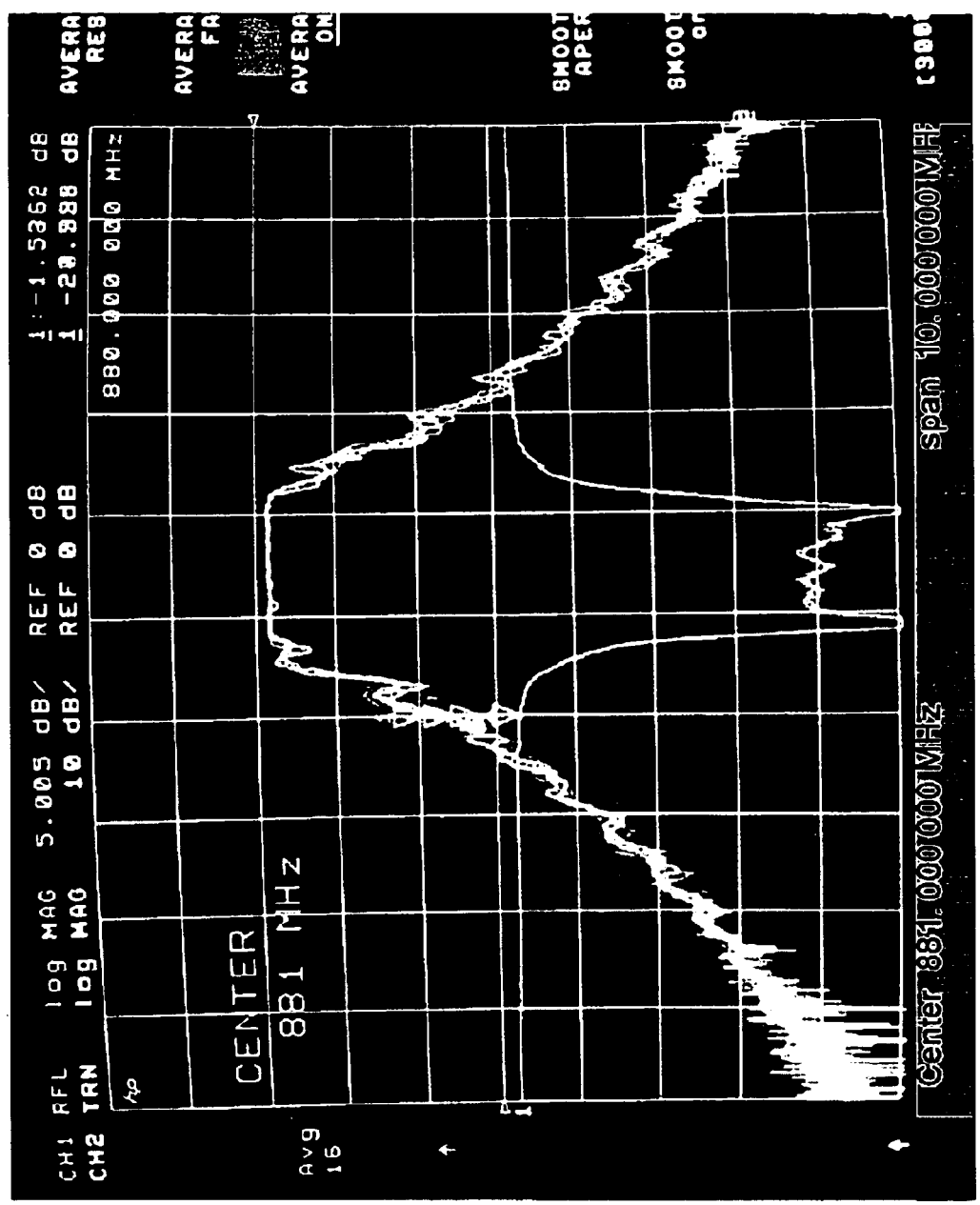
FIG. 11(a) shows the frequency response of the bandpass filter of FIG. 7, with the center frequency of the filter tuned over a 5% range.
Figure 11B:
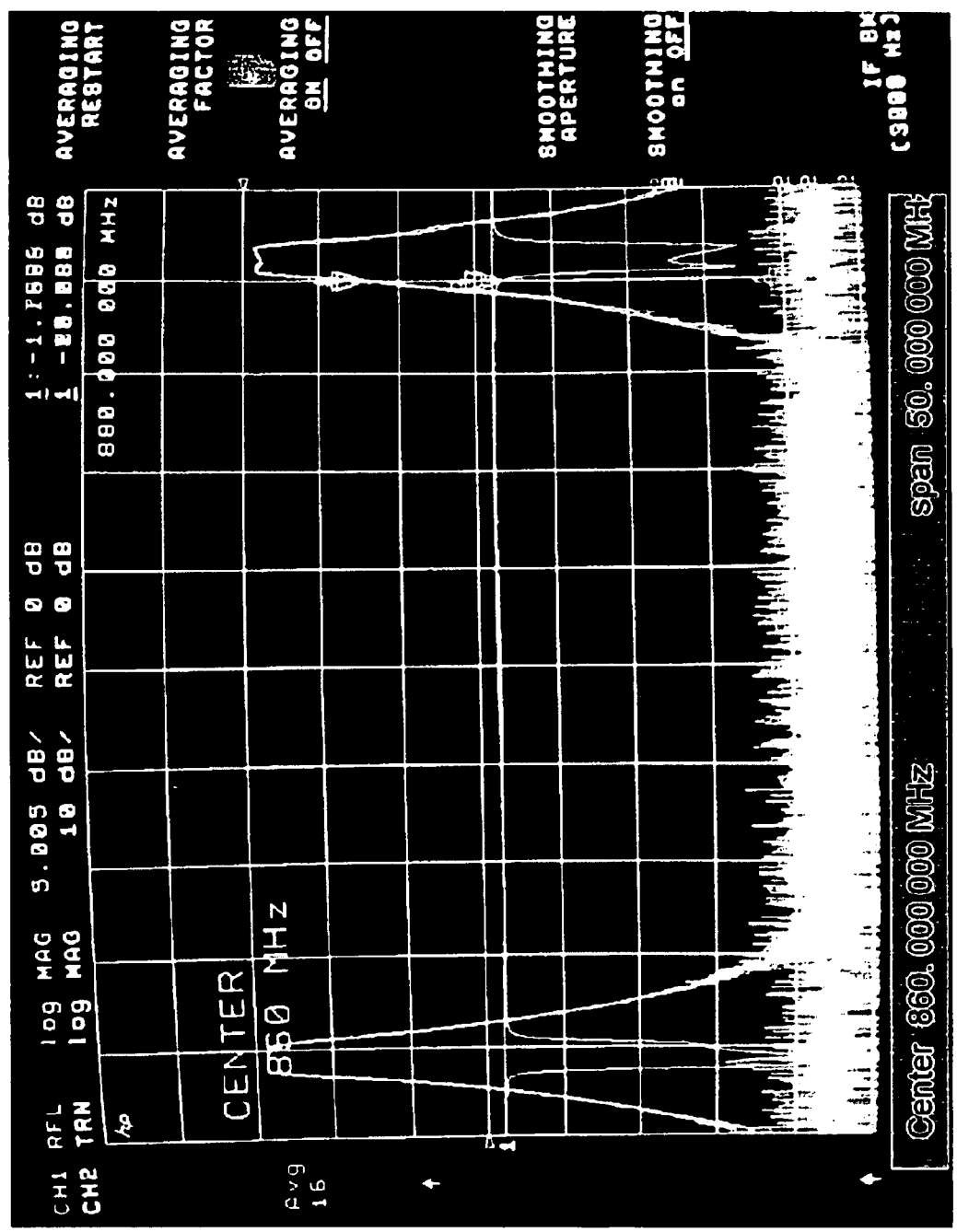
FIG. 11(b) shows in more detail a portion of the frequency response shown in FIG. 11(a)
Figure 12A:
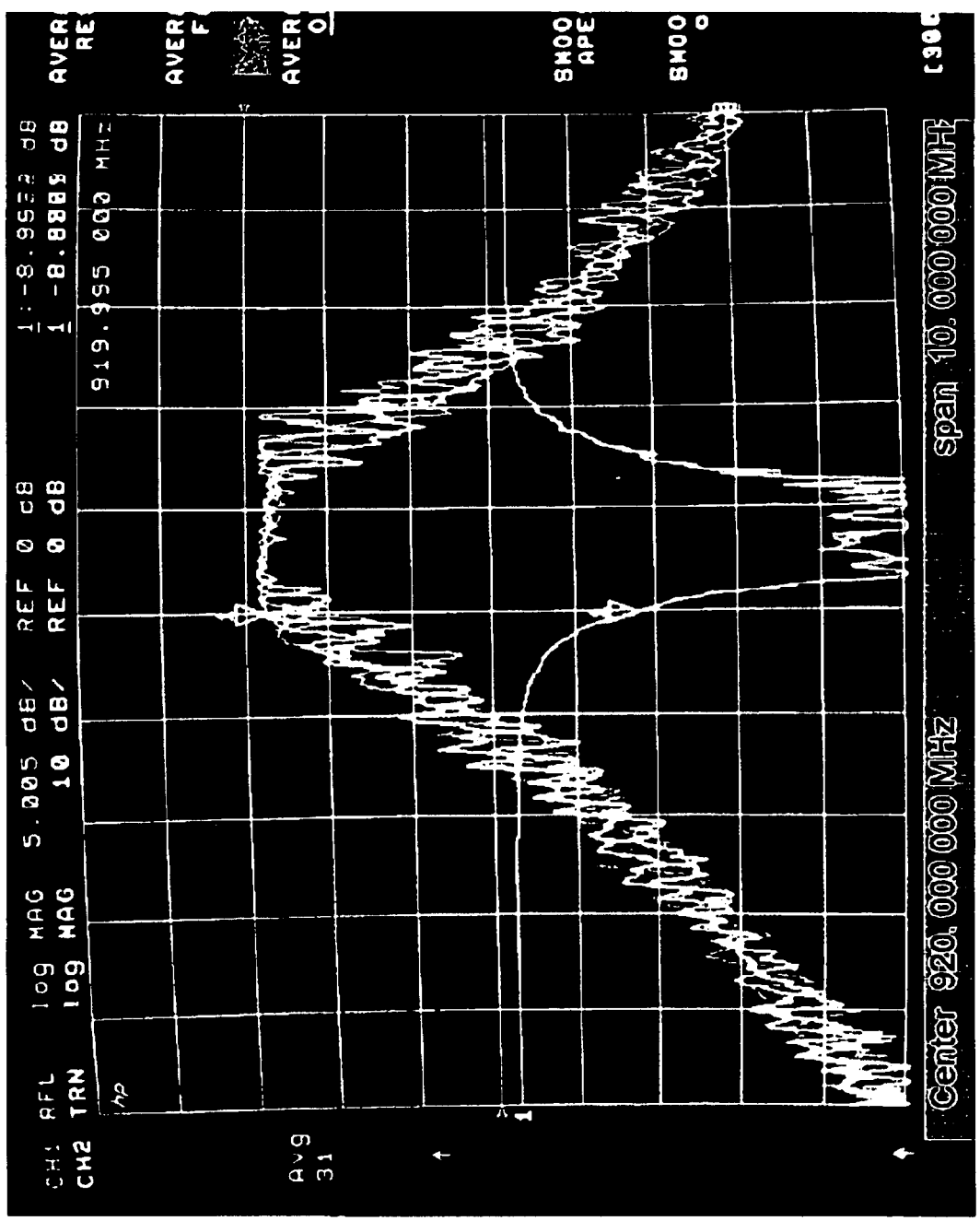
FIG. 12(a) shows the frequency response of the bandpass filter of FIG. 7, with the center frequency of the filter tuned over a 10% range.
Figure 12B:
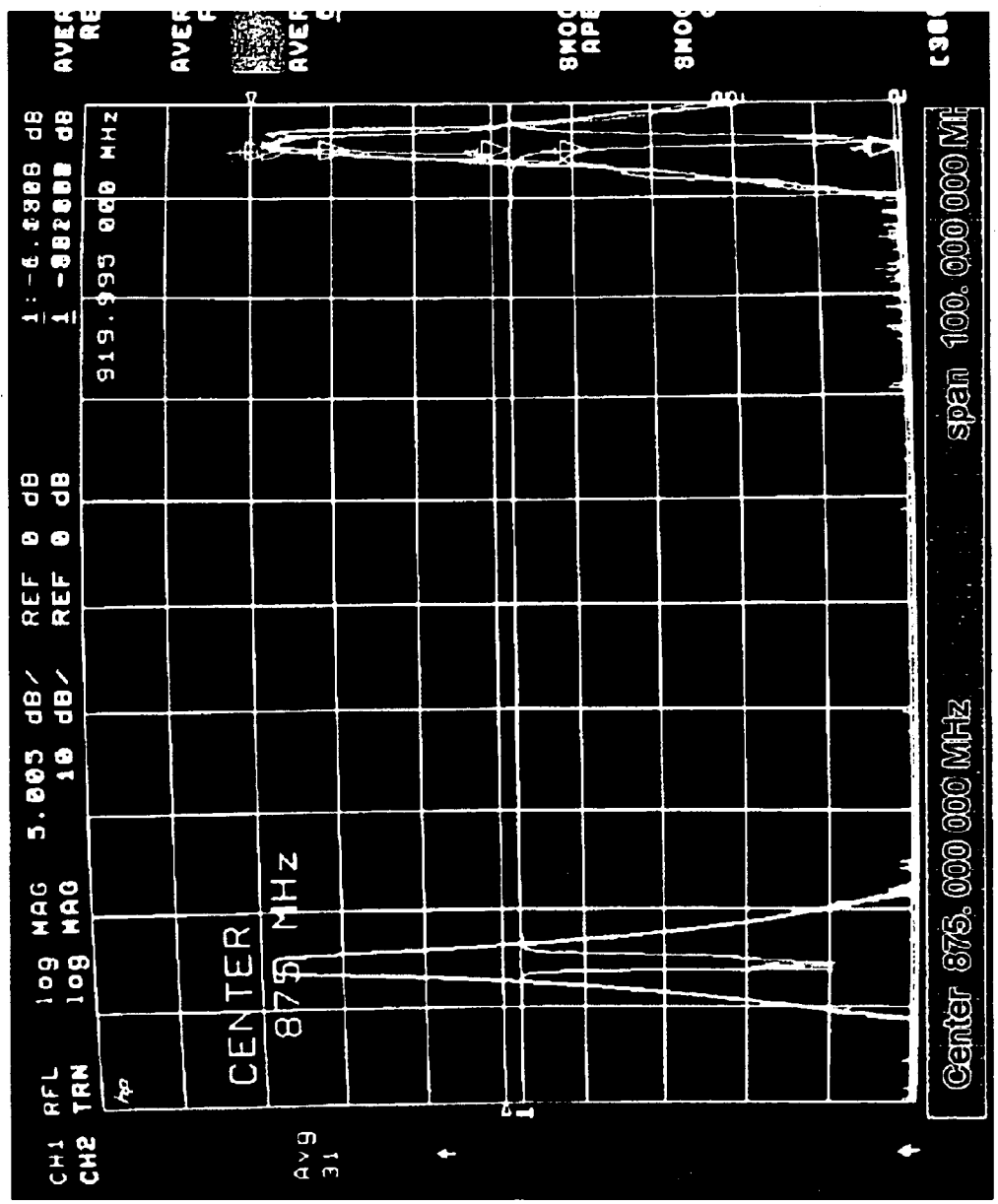
FIG. 12(b) shows in more detail a portion of the frequency response shown in FIG. 12(a)

The same four-pole bandpass filter tuning assembly was used to produce a center frequency shift of 3%, 5% and 10%, as shown in FIGS. 10–12, respectively. As in the previous example, the filter has a bandwidth of about 1.3 MHz and was initially centered at about 839 MHz. In the case of 3% shift in center frequency, the filter was then tuned to increase its center frequency to about 864 MHz. See the frequency response curves for the upwardly tuned filter in FIG. 10(a) and the composite plots of frequency response of the filter at the initial and final frequencies in FIG. 10(b).

In the case of 5% shift in center frequency, the filter was then tuned from 839 MHz to about 889 MHz, or 50 MHz higher. See the frequency response curves for the upwardly tuned filter in FIG. 11(a) and the composite plots of frequency response of the filter at the initial and final frequencies in FIG. 11(b).

Finally, in the case of 10% shift in center frequency, the filter was tuned from 839 MHz to about 923 MHz. See the frequency response curves for the upwardly tuned filter in FIG. 12(a) and the composite plots of frequency response of the filter at the initial and final frequencies in FIG. 12(b). The results illustrated above have proven reproducible, regardless of the direction of tuning.

Figure 17:
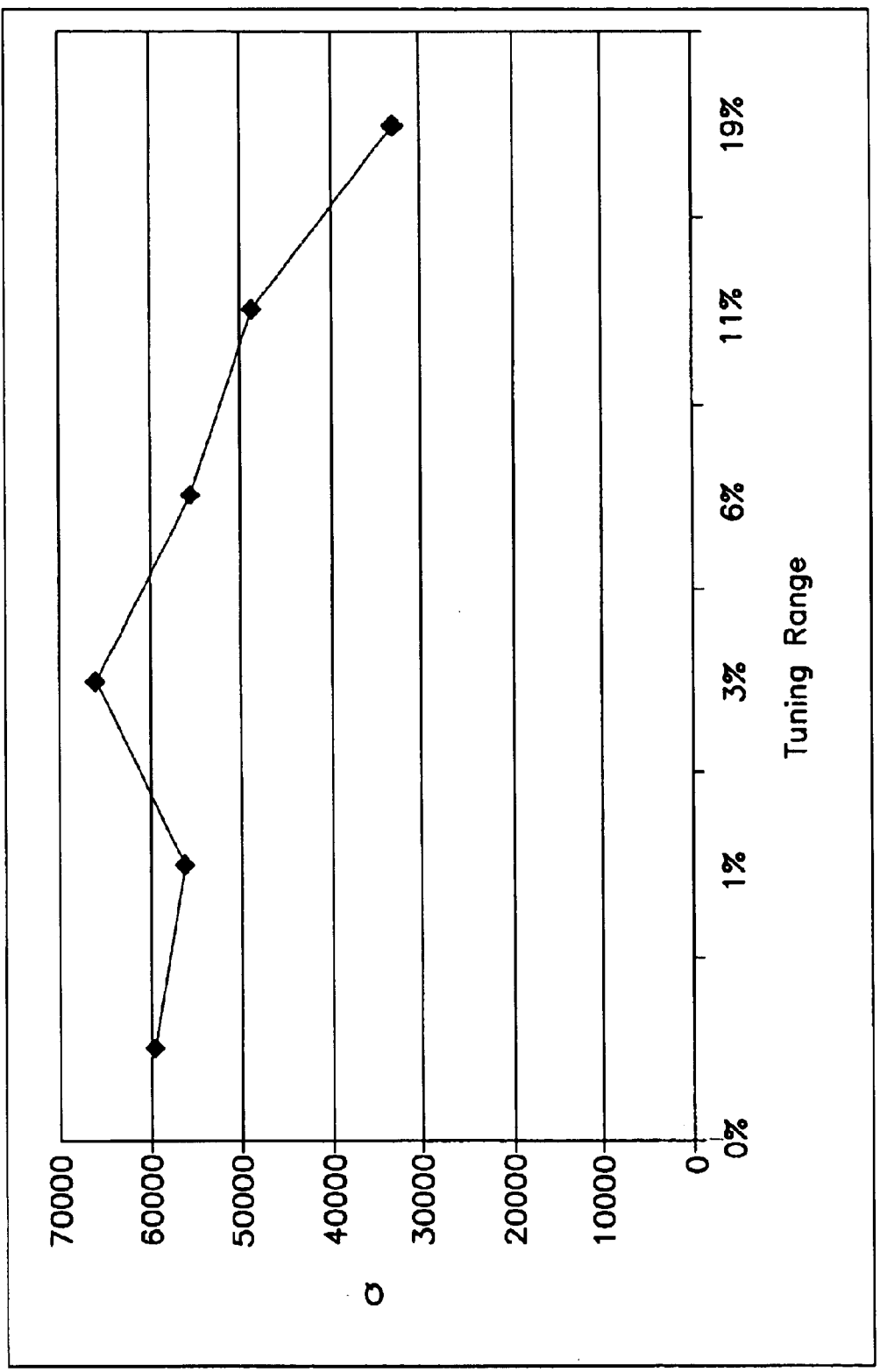
FIG. 17 shows the results of Q-factor measurements for a four-pole notch filter tuned to different center frequencies.

The tuning assembly according to the invention achieves a wide tuning range while maintaining high filter performance. As an example, shown in FIG. 17, a four-pole notch filter was tuned manually over a range of up to 19% of the center frequency. The Q-factor of the filter remained above 30,000 over this range.

Figure 13:
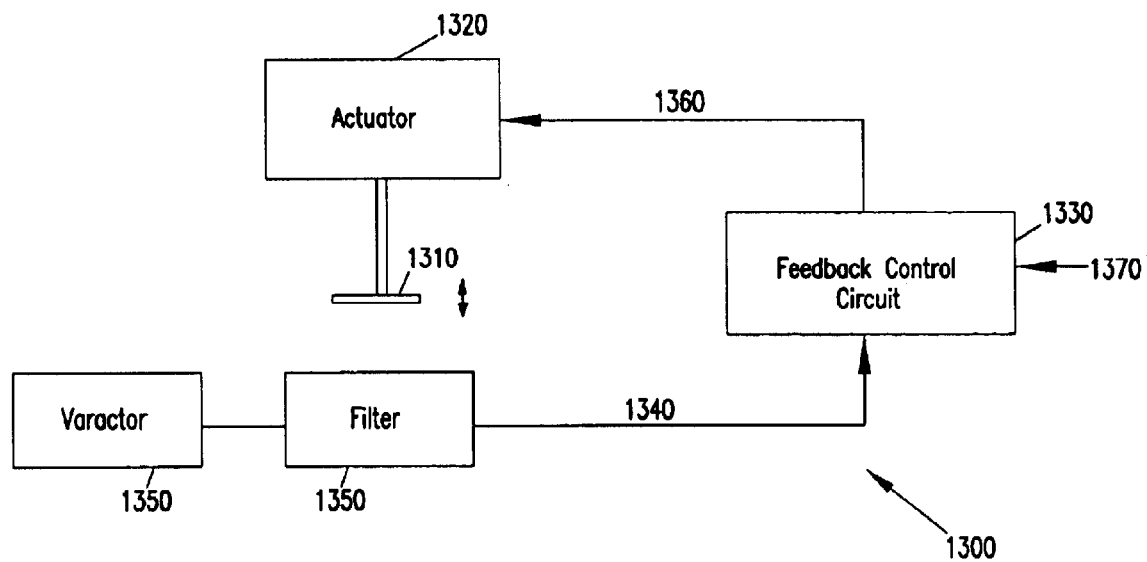
FIG. 13 shows in block diagram form the tuning assembly with a feedback control circuit according to another aspect of the invention.

According to another aspect of the invention, as schematically shown in FIG. 13, the tuning assembly 1300 further includes a feedback control circuit 1330. The feedback control circuit 1330 measures certain parameters 1340, such as the frequency response, of the filter 1350 and outputs control signals 1360 to the actuators 1320 based on the measurement and a reference signal 1370 indicative of the desired filter parameters (such as center frequency). The actuator 1320 for each resonator moves the respective tuning tip 1310 in response to the signals 1360. This process continues until the desired resonant frequency for each resonator in the filter 1350 is reached.

Figure 14A:
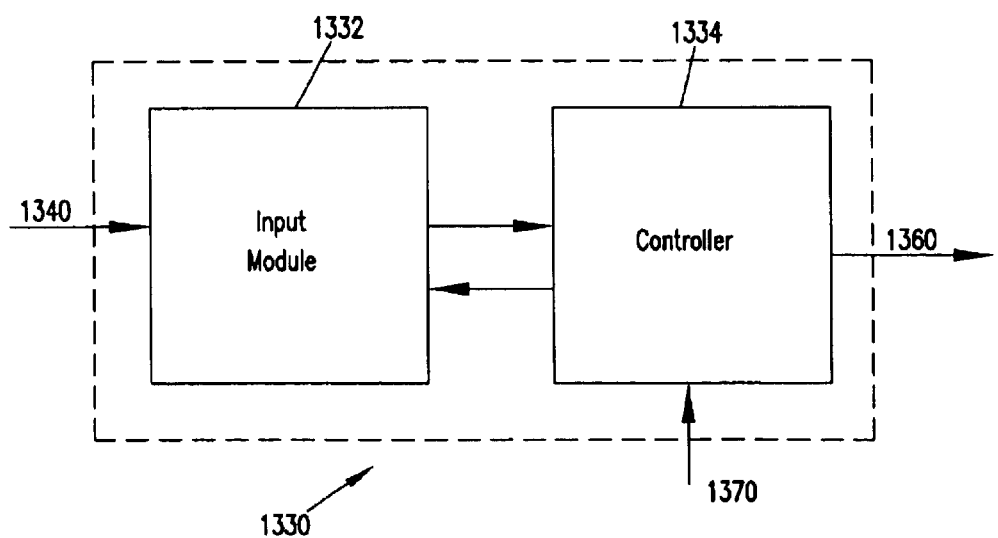
FIG. 14a shows in block diagram form the feedback control circuit.

The feedback control circuit 1330, as schematically shown in FIG. 14(a), includes an input module 1332 for measuring filter parameters. The input module 1332 can be as sophisticated as a complete network analyzer or as simple as a fixed sweep circuit, depending on the application needs. For example, for pre-shipment filter calibration, a control circuit with a network analyzer can be used; for in-field applications, a simpler input module may be used.

The feedback control circuit also includes a controller 1334, which can be a processor or computer programmed to perform desired control functions. The controller 1334 instructs, if needed, the input module 1332 to measure the filter parameters and outputs the control signals 1360 in response to the measurement and the reference signal 1370.

Figure 14B:
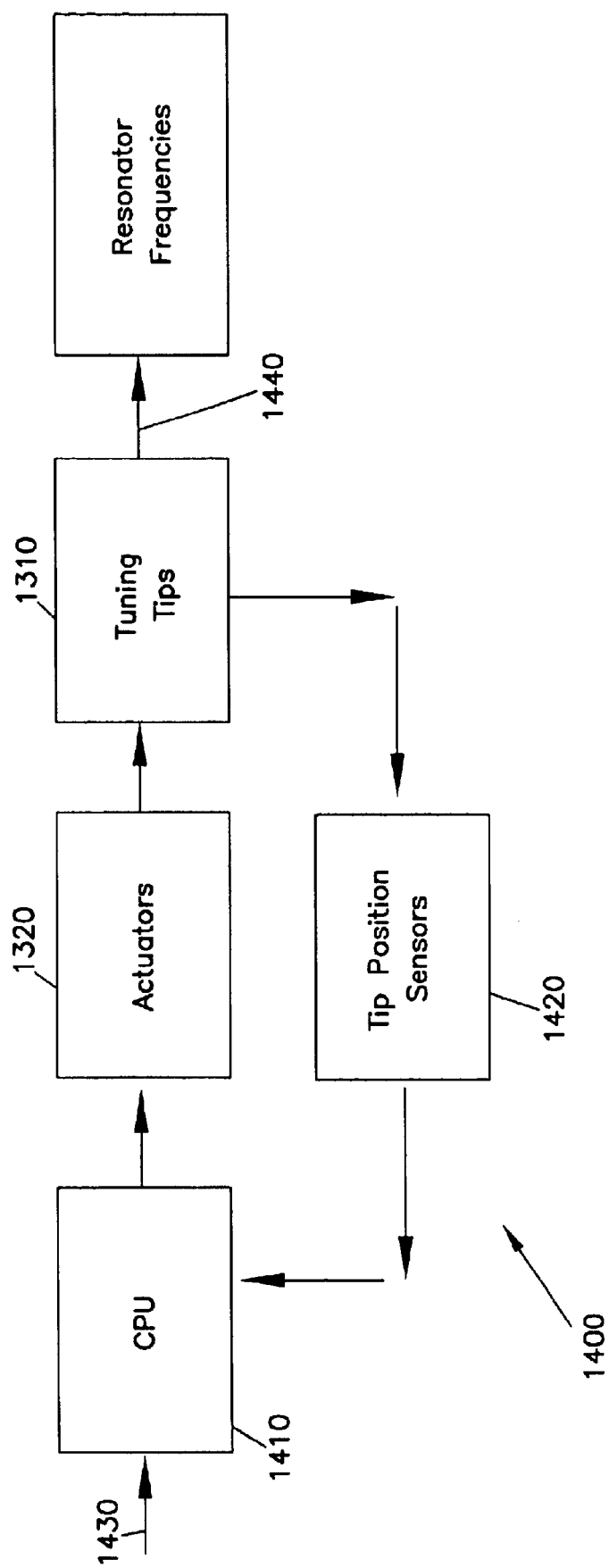
FIG. 14b shows in block diagram form the tuning assembly with another feedback control circuit according to another aspect of the invention.

The movement of the tuning tips 1310 can also be accomplished by a feedback control system, as schematically illustrated in FIG. 14(b). The control system 1400 includes a controller such as a processor or computer 1410, which takes input from a tuning tip position sensor 1420, described in more detail in examples below. The controller drives the actuators 1320 based on a position-setting command 1430. The actuators 1320 move the tuning tips 1310, thereby adjusting (1440) the resonator frequencies.

According to another aspect of the invention, automatic tuning can be achieved. A network analyzer is used to measure the frequency response of a four-pole notch filter. The output of the network analyzer is used by a computer to calculate signals for driving the actuators.

Figure 16A:
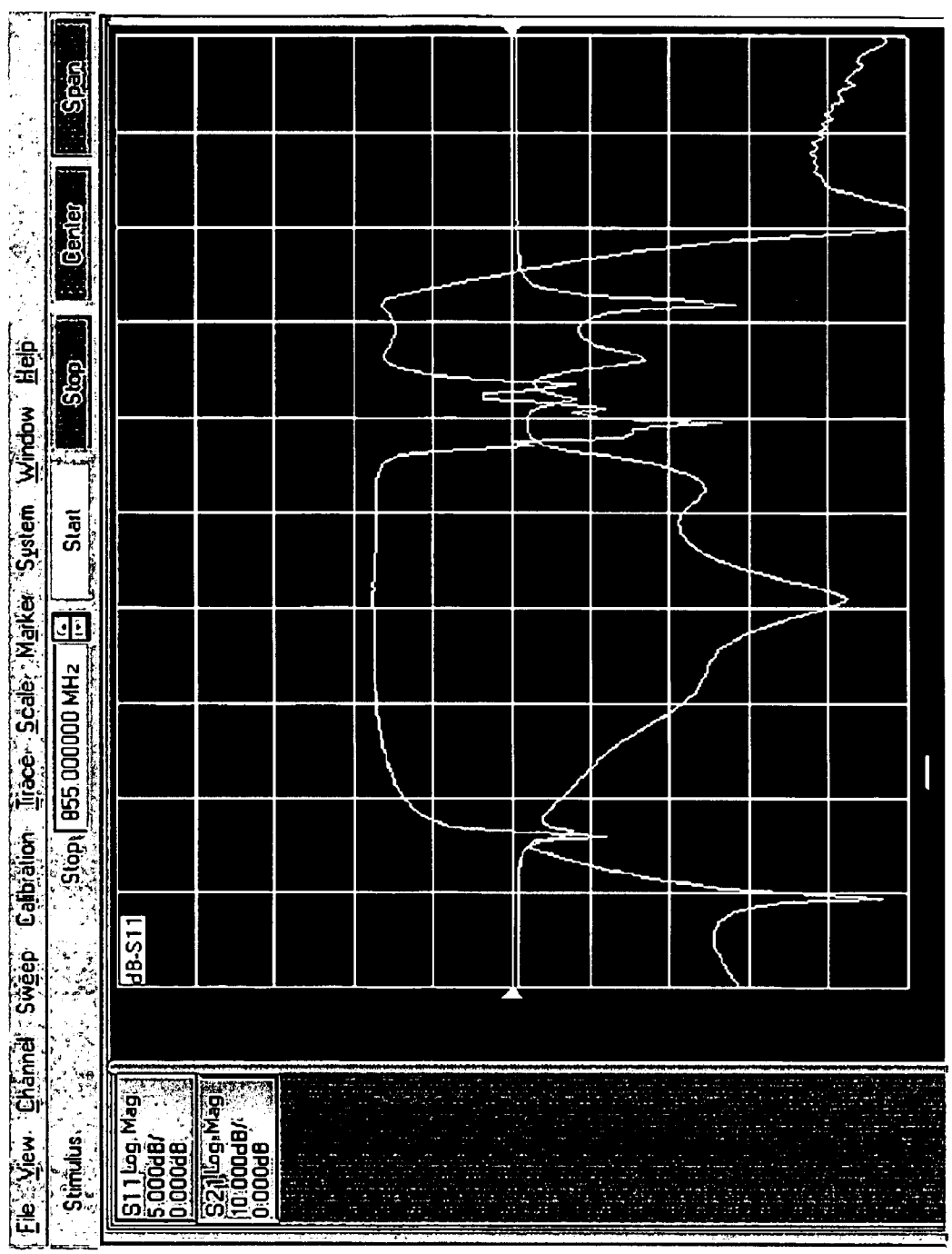
FIG. 16a illustrates the frequency response of a filter prior to automatic tuning is performed according to an aspect of the present invention.
Figure 16B:
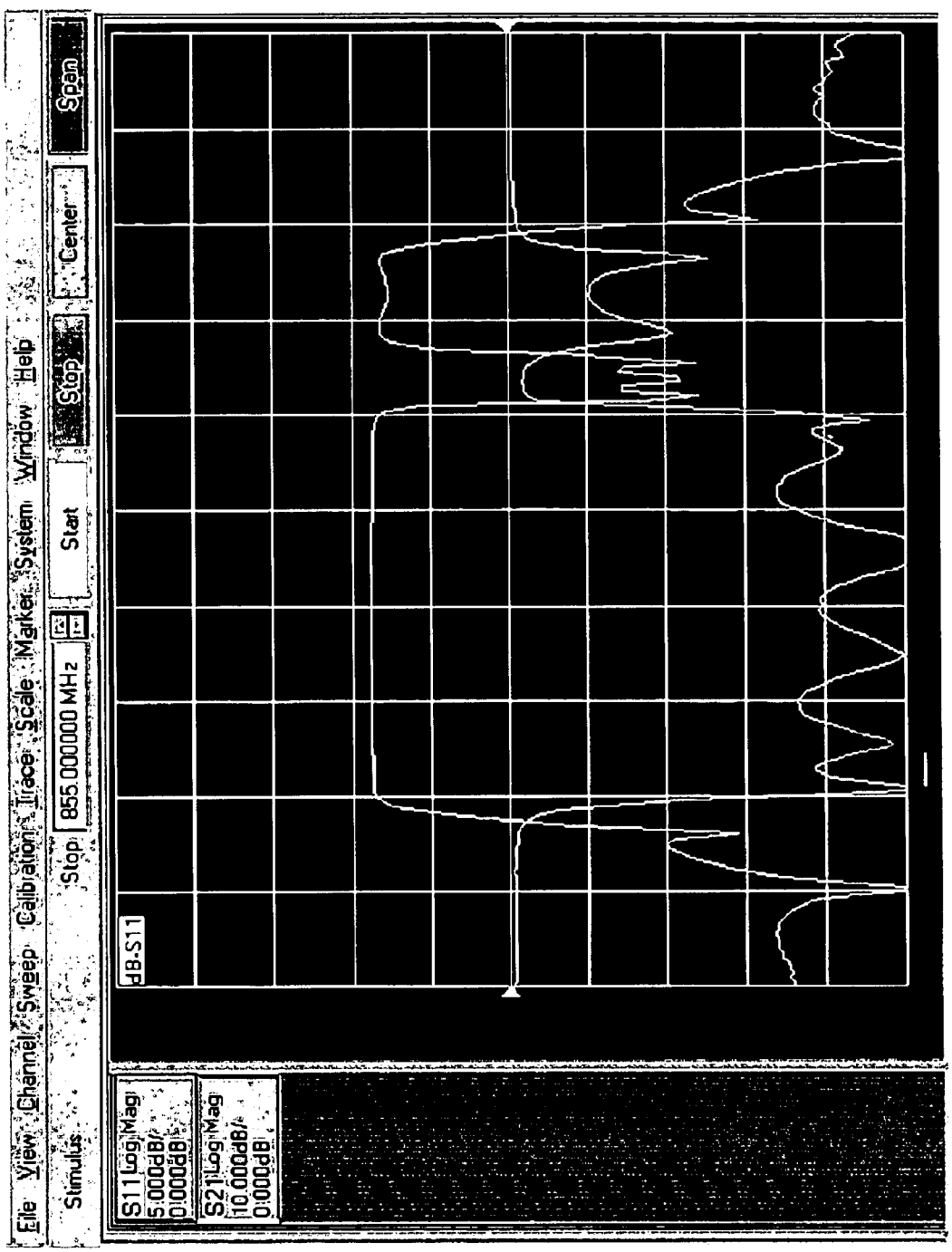
FIG. 16b illustrates the frequency response of the same filter as the one the frequency response prior to tuning is shown in FIG. 16a, but after automatic tuning is performed according to an aspect of the present invention.

An algorithm for automatic tuning was selected according to the following considerations. An automatic approach should formalize the human experience of the tuning process. During the manual tuning, the operator starts with an untuned filter output on a network analyzer. The method of the manual tuning is to make reflection or R(f), as small as possible in certain range of frequencies, in this particular case 835–845 MHz, and, to minimize values of transmitted signal, or T(f), in the notch range, 845.25–846.25 MHz. According to this, the following automatic tuning algorithm was developed, which uses the formal mathematical approach of minimization of certain functional, as a function of tuning parameters. In the examples shown in FIGS. 16a and 16b, the tuning was accomplished with varactors, but the algorithm is equally applicable to the mechanical tuning of the invention. The algorithm consists of the following steps:

1. A computer acquires the values of reflected and transmitted signals in full filter band ($f_0$; $f_1$) from a network analyzer and some starting position of all tuning electrodes.
2. A function $\Phi(v_1, v_2, \ldots v_i)$, where $v_1, v_2 \ldots v_i$ are positions of the tuning electrodes, is constructed by the following rule:

$$\Phi(v_1, v_2, \ldots, v_i) = \sum_{f=f_1}^{f=f_0} F(R(f)) + \sum_{f=f_1}^{f=f_0} F(T(f)) \quad (1)$$

where F( ) is cut-off function, designed to transfer logarithmic output R(f), T(f) of the network analyzer to linear values and to cut-off very low values of signal, increasing by that, sensitivity of the functional $\Phi$ to the electrodes positions. At the first stage function F( ) transforms input data to the linear scale:

$$R_{linear} = 10^{(R-Threshold)/10} \quad (2)$$

Where Threshold– is cut-off level. $F(R_{linear})$ is then computed by the formula:

$$F(x) = 0, x < 1.0; F(x) = (x-1.0)^2, x \geq 1 \quad (3)$$

3. Since functional $\Phi(v_1, v_2, \ldots, v_i)$ can be evaluated for any values of parameters, it can be a subject of minimization by a mathematical algorithm. A number of numerical minimization algorithms for can be used for this purpose. Such algorithms are well known and can be found in, for example, William H. Press, et al., "Numerical Recipes in C", Cambridge University Press (1996). Two algorithms were tested: (1) the Directions Set Method, Id. at 412–416, and (2) the Downhill Simplex Method, Id. at 408–412. Both methods produced similar final results, although it was thought that the second one resulted in faster convergence for the class of the functions considered.

Since the algorithm assumes infinite intervals for independent variables, while the real positions of the electrodes have some interval [a, b], variables, substituted to the algorithm are computed by the following formula $$\mu_i = Arth((2.0\, v_i - a - b)/(b - a)) \quad (4),$$

which maps positions of electrodes from interval [a, b] to the interval [$-\infty$, $+\infty$]. This algorithm changes values of the $\mu_1, \mu_2, \ldots, \mu_i$, and computes real positions of electrodes by the formula $$v_i = 0.5(a + b + (b-a)th\mu_i) \quad (5),$$

which is the inverse to Equation (4).

4. Algorithm returns to the step 1, unless desirable precision of minimization is not achieved. On each step the algorithm produce a set of possible values of minimized function $\Phi$, and criteria of convergence is $$0.5(\Phi_{max} - \Phi_{min})/(\Phi_{max} + \Phi_{min}) < \epsilon \quad (6),$$

where the notations are self-explanatory. Full cycle of tuning takes about 3 min with a 233-MHz PC. The code was written on Microsoft Visual Basic 6.0.

Figure 15A:
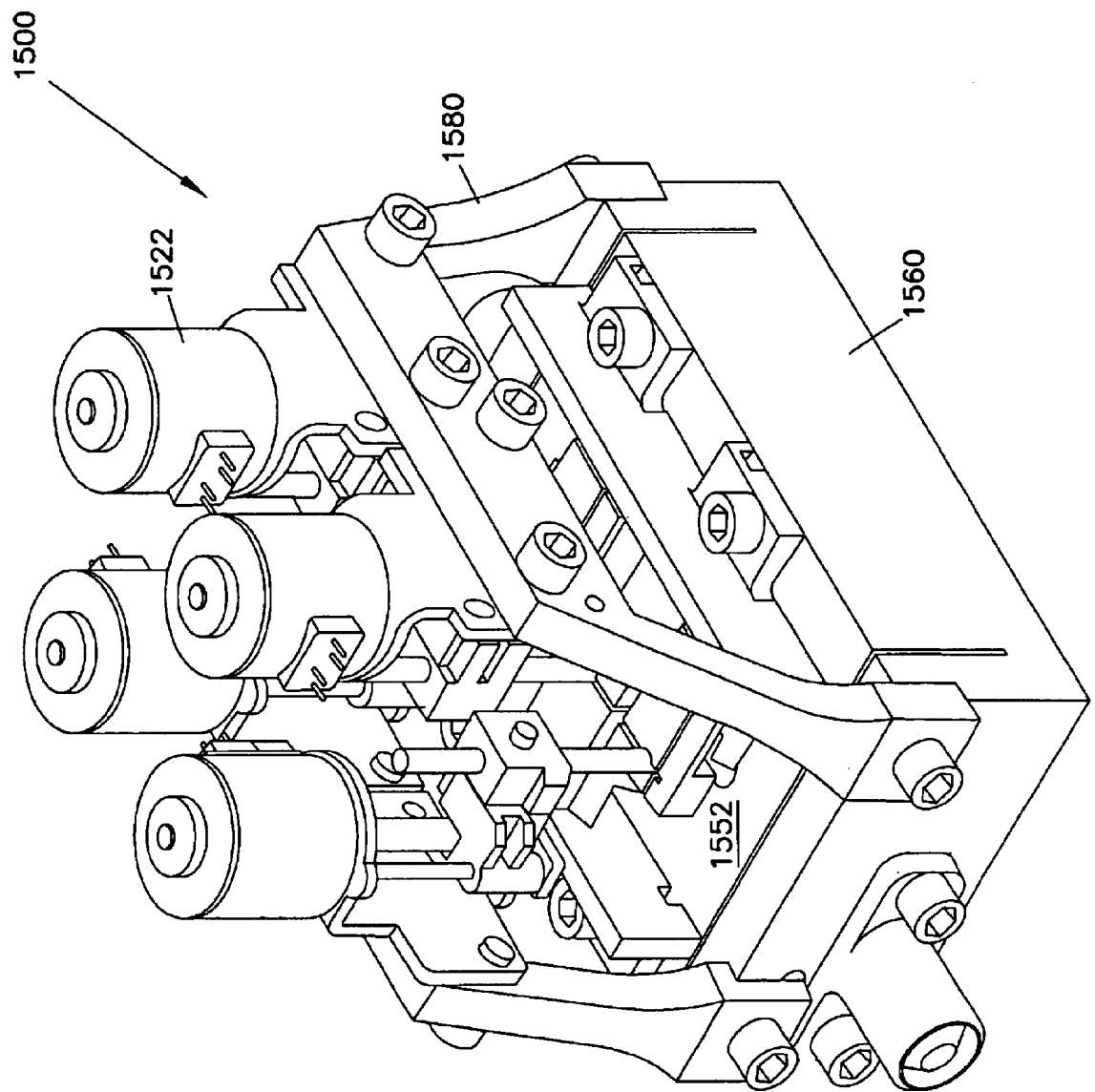
FIG. 15a schematically shows a tuning assembly according to another aspect of the invention.
Figure 15B:
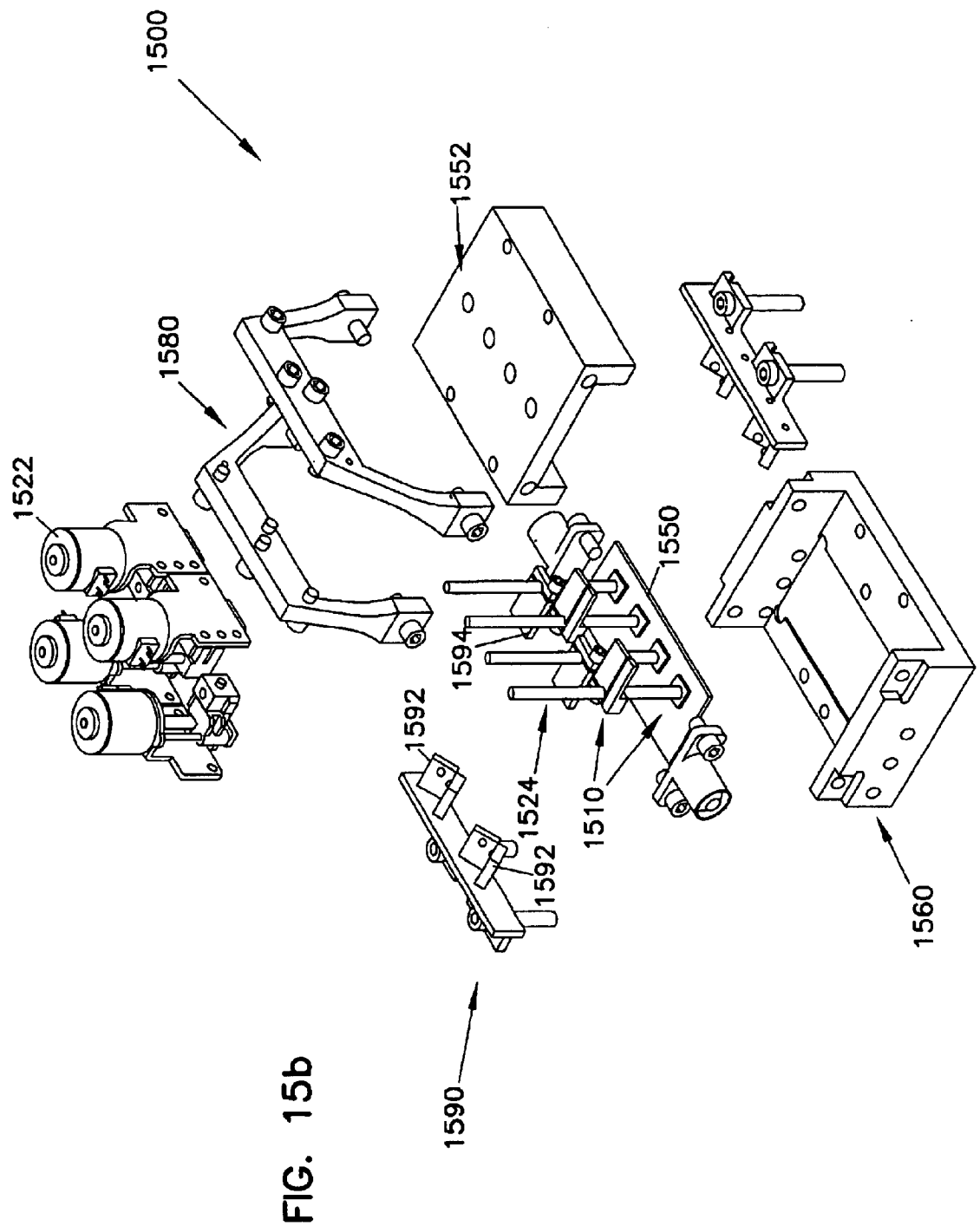

Another example of the tuning assembly and method according to the invention is schematically illustrated in FIGS. 15(a) and 15(b). The tuning assembly 1500 includes one or more superconductive tuning tips 1510, each attached to a moving arm 1524, which is attached to and moveable by a motor drive 1522 such as a miniature stepping linear actuator (Lin Engineering Part # LS10N20S-001). The motor drives 1522 are mounted on a thermally insulating frame 1580, which is in turn mounted on a base 1560. A high-temperature superconductor filter 1550 is shielded inside a brass housing 1552, which is also mounted on the base 1560. The tuning tips 1510 are positioned above the individual resonators (not shown) of the filter. The distances between the tuning tips and their respective resonators are adjusted by the motor drives 1522. Other components similar to those used in the tuning assembly shown in FIGS. 2 and 3 can be used to addressing various design considerations. For example, a thermal isolator can be included along the moving arm 1524 to allow the motor drives 1522 to operate at non-cryogenic temperatures while maintaining the filter 1550 at cryogenic temperatures.

Additionally, the tuning assembly 1500 includes a sensor assembly 1590, which measures the position or motion of the tuning tips 1510. Measuring the position or motion of the tuning tip facilitates closed-loop feedback control of the tuning tips 1510. Such control is generally more precise than merely relying on the stated, or even calibrated, step distances of the motor drives because the mechanical properties of the motor drives may change over time due to a variety of reasons.

Figure 15C:
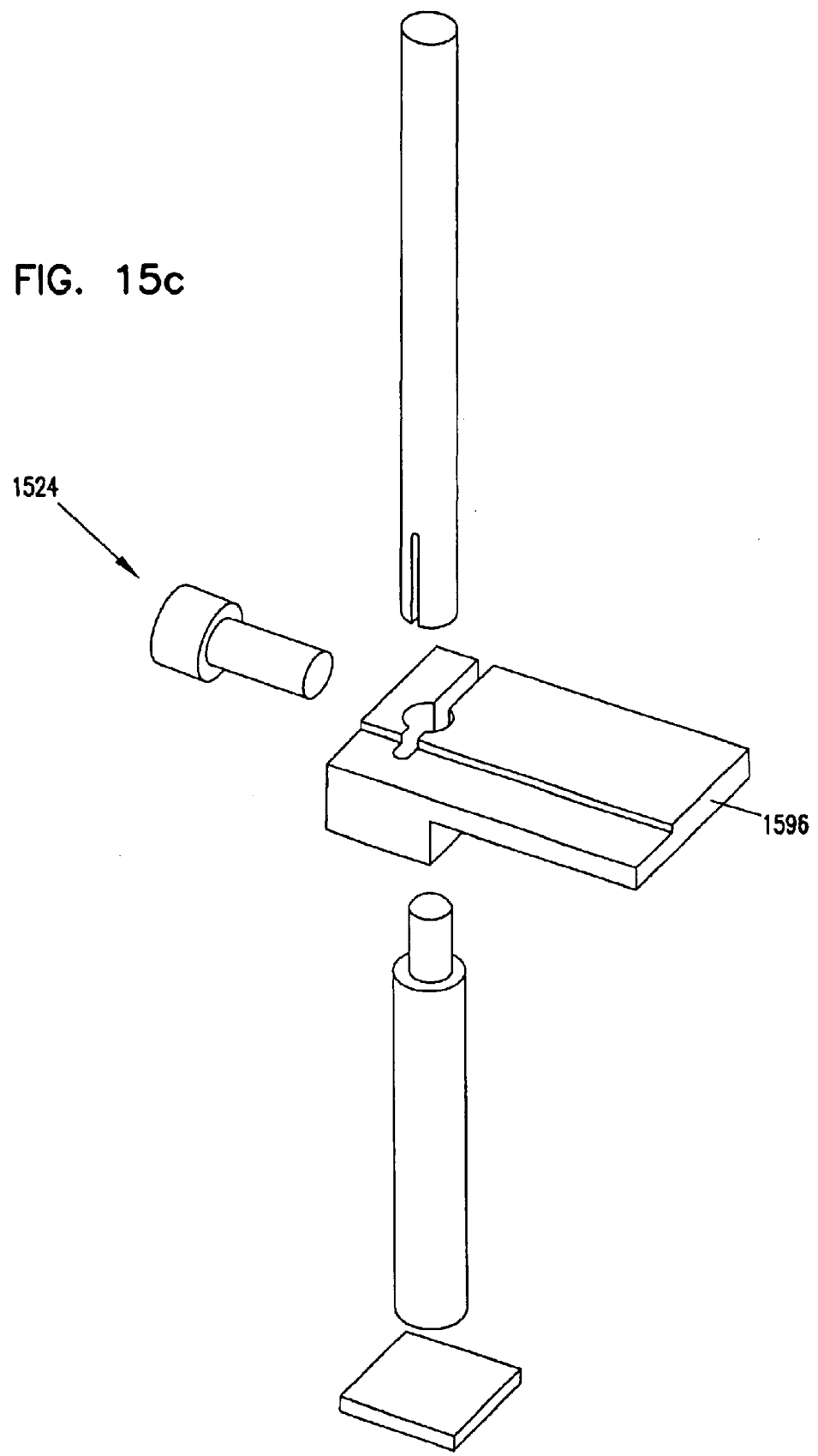
FIG. 15c schematically shows a tuning actuator according to an aspect of the present invention.

The sensor assembly in the illustrative embodiment includes one or more optical (including infrared wavelength) sensors 1592, but can additionally or instead include other suitable sensors such as magnetic or capacitive sensors. Optical positional sensors are well known. In the illustrative embodiment, each optical sensor includes a light emitter such as a light-emitting diode (LED, Honeywell/Microswitch Part # SEP8706-003) and a light receiver such as a photo diode or photo transistor (Honeywell/Microswitch Part # SDP8406-003). Changes in tip position may be measured in a variety of ways, including, but not limited to direct reading (emitter moves toward or away from receiver), beam path interruption (a shutter moves with respect to the emitter/receiver pair), or reflective (a reflector moves with respect to the emitter/receiver pair). The sensor assembly in the illustrative embodiment is of the reflective type, with a reflector, or sensor flag, 1596 attached to, or being integral with the moving arm 1524. See FIG. 15(c). The position of the tuning tip 1510 can therefore be measured based on the reflection of the optical beam from the emitter into the receiver. The detected position or motion of the tuning tip can be displayed or used as input to a motor drive controller, which advances or retracts the tuning tip until the tip is at the desired position.

Figure 18A:
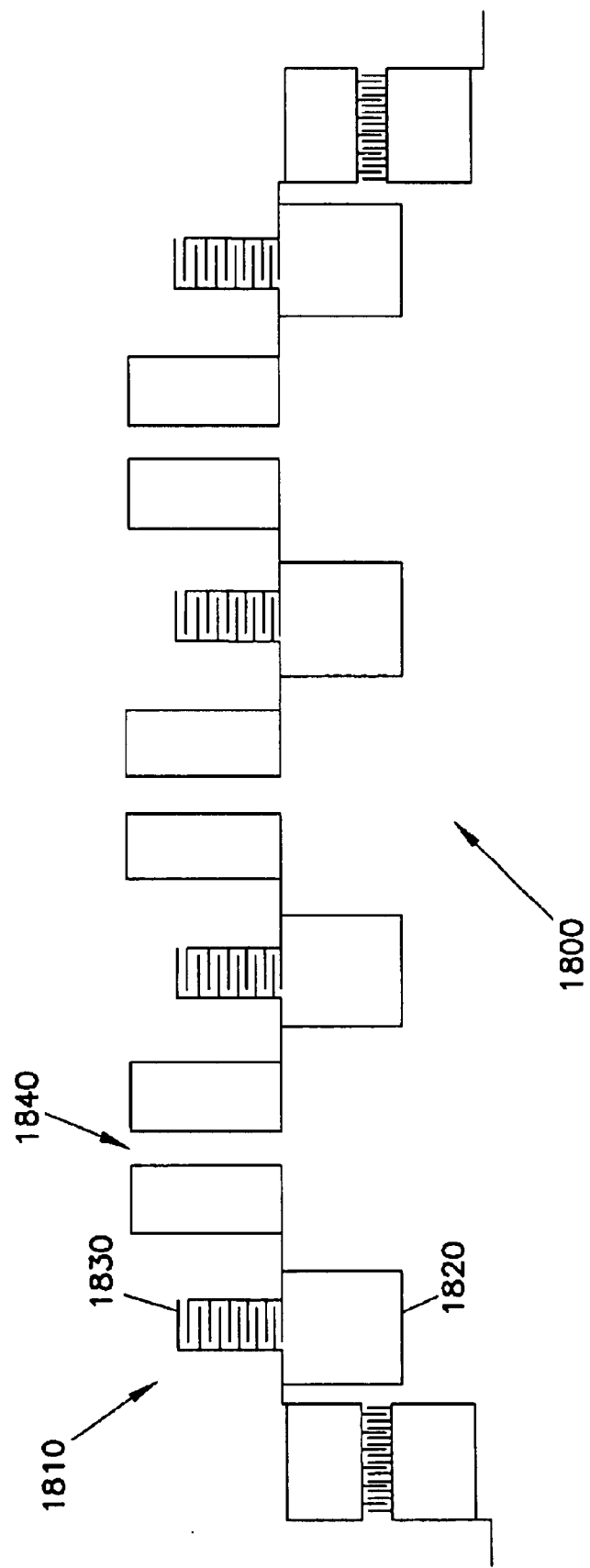
FIGS. 18a and 18b schematically show two configurations of a four-pole bandpass filter according to an aspect of the invention. The tuning tip of a tuning assembly can be positioned above the half-loop inductor or the interdigital capacitor.
Figure 18B:
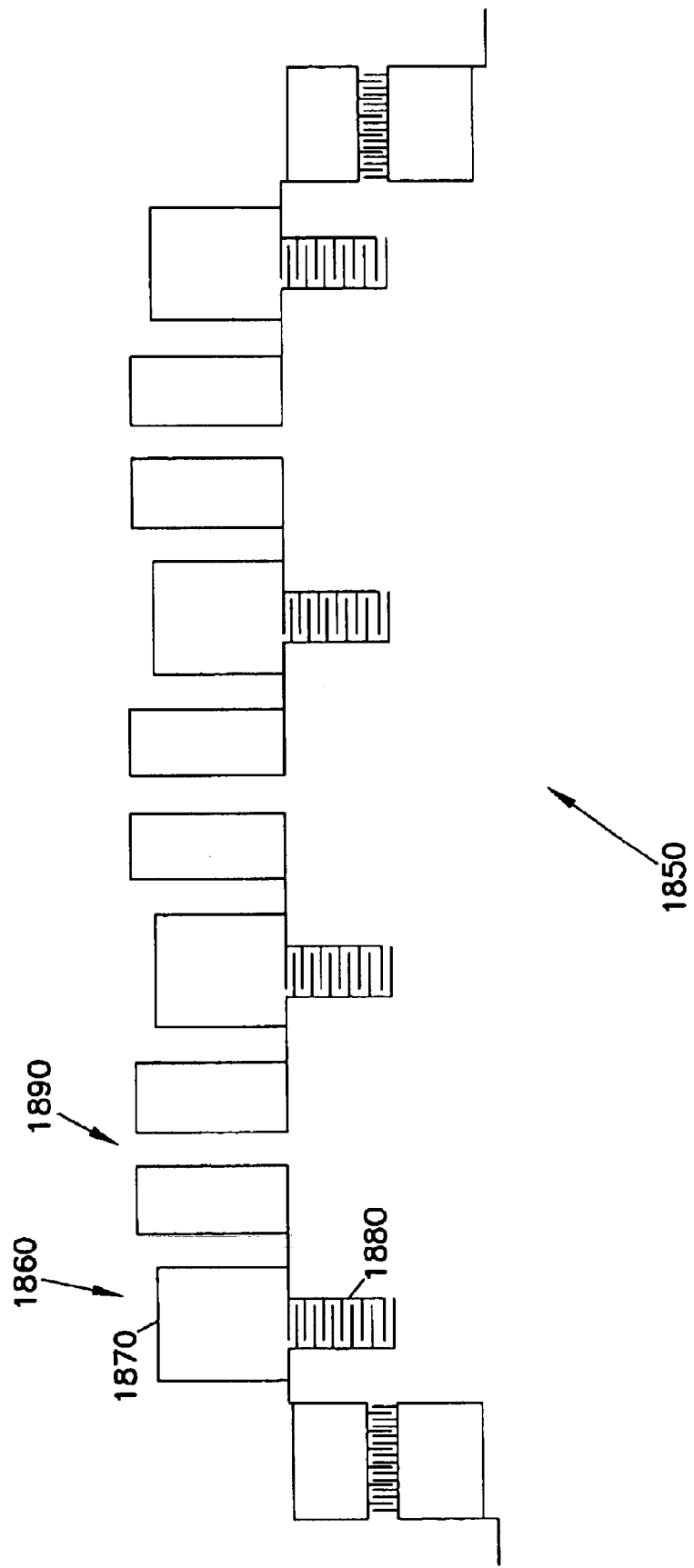

Precise, wide-range tuning of filters can also be achieved in other ways according to the invention. For example, as illustrated in FIG. 18(a), a filter 1800 can include resonators 1810 having interdigital capacitors 1830 outside, the half-loop inductor 1820, rather than inside as described above. The filter also includes coupling members 1840 between adjacent resonators. A filter 1850, as illustrated in FIG. 18(*b*), can also have resonators 1860 with the positions of the half-loop inductor 1870 and interdigital capacitor 1880 flipped relative to those in FIG. 18(*a*) and similar inter-resonator coupling members 1890 as those in FIG. 18(*a*). A tuning assembly can be configured to position the tuning tips above the half-loop inductor 1820, 1870 or interdigital capacitor 1830, 1880 to achieve wide-range tuning. The inventors of the invention have discovered that, as shown in FIG. 19, the tuning range achievable by positioning the tuning tip above the half-loop inductor is greater than by positioning the tuning tip above the interdigital capacitor.

The ability to tune a resonator in two or more of its different parts provides another way to tune filter over a wide range of frequencies with precision. Using the filter 1800 in FIG. 18(*a*) again as an example, a first tuning tip for coarse tuning can be positioned above the half-loop inductor 1820, and a second tuning tip for fine tuning can be positioned above the interdigital capacitor 1830. The second tuning tip may be a superconductor or a dielectric material. A dielectric tip produces much smaller tuning ranges than a superconductor tip. Thus, a dielectric tip can be used for fine tuning. Because the tuning range is smaller from the interdigital capacitor than from the inductor, the second tuning tip can be used to obtain precisely the desired frequency after the first tuning tip has be used to bring the center frequency into the range of the second tuning tip.

The coarse tuning of center frequency can also be combined with tuning of the bandwidth of the filter. In this case, a tuning tip, either of a superconductor or a dielectric material is positioned over the capacitors that lie between two resonators 1840. As the tip is moved toward or away from the capacitor, the coupling strength between resonators changes, causing the bandwidth to change. For a superconductive tip, moving the tip toward the capacitor decreases the capacitance and narrows the bandwidth. For a dielectric tip, moving the tip toward the capacitor increases the capacitance and widens the bandwidth.

Another approach to coarse/fine tuning incorporates two actuators per each tuning tip. A coarser actuator with a longer range such as a stepper motor carries a more precise device with a shorter range such as a piezoelectric actuator which, in turn, carries the tuning tip.

Another approach to coarse/fine tuning incorporates a varactor to achieve the fine tuning (best seen in FIG. 13 at designation 1351). U.S. patent application Ser. No. 09/633,592 describes the use of varactors to tune superconductive filters.

Figure 20:
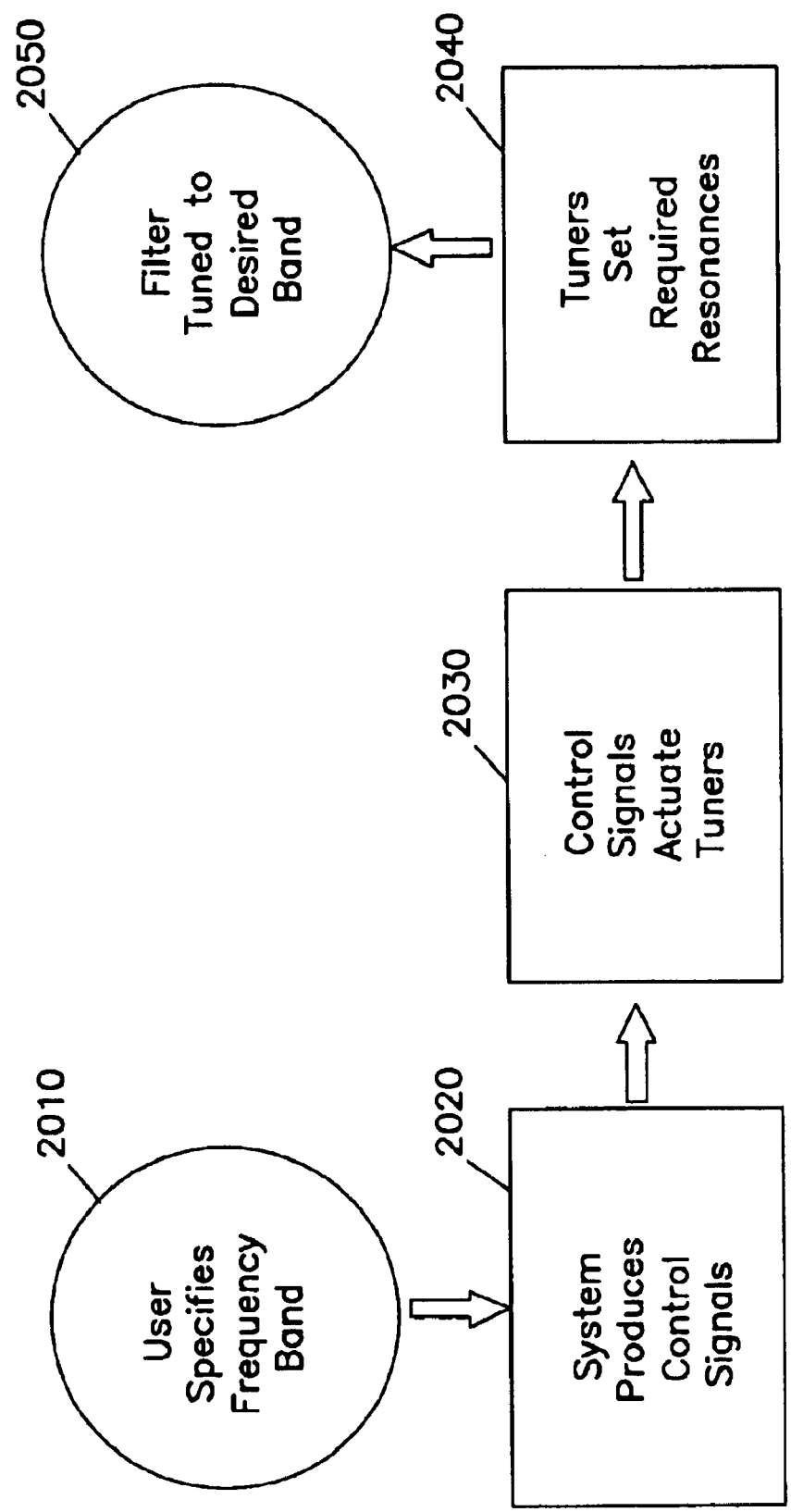
FIG. 20 shows a block diagram of the components of the invention.

Thus, the device and method according the invention provide accurate, wide range tuning of filters without significant sacrifice of the filter performance. Generally, using the invention, a user can specify a desired frequency band or a sequence of events with varying frequency bands (2010 in FIG. 20). The device according the invention produces the control signals accordingly (2020) to position the tuning tips with the actuators (2030). The positioning of tuning tips sets the resonant frequencies of the resonators or coupling between the various resonators in a filter (2040), thereby setting the filter to the desired band (2050).

Such capabilities provide numerous advantages over conventional filters. For example, filters that are tunable over a wide range of frequencies provide flexibility in field applications. The end user can change the center frequency of a filter either because the user's need has changed or because the center frequency of the filter has drifted over time. The controller for driving the actuators can also be programmed to periodically check the center frequency of a filter and automatically recalibrate the filter if necessary. The need to specially order multiple filters with custom frequencies or take filter off-line to be sent back to factory for recalibration is thus reduced or eliminated. For the filter manufacturers, general-purpose filters can be manufactured and be at ready, and the center frequencies of filters can be custom-set for quick shipment. The filter can also be programmed to scan a range of frequencies or jump among a set of predetermined frequencies for frequency hopping applications for commercial and military uses.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A tuning assembly for tuning a resonant frequency comprising:
   a resonator having a first component and a second component;
   a plurality of tuning tips, at least one of the tuning tips including a superconductor; and
   a plurality of actuators, each actuator being operatively linked to a corresponding tuning tip for positioning a first of the plurality of tuning tips at a range of distances from the first component and a second of the plurality of tuning tips at a range of distances from the second component.

2. The tuning assembly of claim 1, wherein each of the plurality of actuators are further configured and arranged to vary the distance between a corresponding tuning tip and the resonator in steps that correspond to resonant frequency changes of about 0.01% or less of the resonant frequency.

3. The tuning assembly of claim 1, wherein each of the plurality of actuators comprises a driver and a movable arm, wherein the movable arm is coupled between the driver and a tuning tip.

4. The tuning assembly of claim 3, wherein the driver comprises an electro-mechanical device.

5. The tuning assembly of claim 3, wherein a tuning tip is a superconductor having a size at least as large as a footprint of an inductor of the resonator.

6. The tuning assembly of claim 3, wherein the driver is configured and arranged to operate at a higher temperature than a tuning tip, and wherein the movable arm comprises a thermal isolator positioned between the tuning tip and the driver.

7. The tuning assembly of claim 1, further comprising a position sensing device configured so as to measure the position of a tuning tip.

8. The tuning assembly of claim 7, wherein the position sensing device is a reflective device.

9. The tuning assembly of claim 7, wherein the position-sensing device is a direct reading device.

10. The tuning assembly of claim 7, wherein the position-sensing device is a beam path interruption device.

11. The tuning assembly of claim 7, wherein the position sensing device and a corresponding actuator are employed in a closed-loop feedback control system intended to control a distance between the tuning tip and the resonator.

12. The tuning assembly of claim 1, further comprising a frequency sensing device for measuring output frequency of the resonator.

13. The tuning assembly of claim 12, wherein the frequency sensing device and a corresponding actuator are employed in a closed-loop feedback control system intended to control the distance between a tuning tip and the resonator.

14. The tuning assembly of claim 13, wherein the closed-loop feedback control system further comprises a fixed sweep circuit for measuring filter parameters.

15. The tuning assembly of claim 1, wherein the actuator linked to the first of the plurality of tuning tips coarsely tunes the resonator.

16. The tuning assembly of claim 1, wherein the actuator linked to the second of the plurality of tuning tips finely tunes the resonator.

17. The tuning assembly of claim 1, wherein the first component is an inductor.

18. The tuning assembly of claim 1, wherein the second component is a capacitor.

19. The tuning assembly of claim 1, wherein the range is sufficient to cause a resonant frequency of the resonator to vary by at least about 1% of the resonant frequency.

20. A tunable filter, comprising:
(a) a planar filter having at least a resonator, the resonator having a first component and a second component; and
(b) a tuning assembly comprising:
(i) a plurality of tuning tips, at least one of the tuning tips including a superconductor; and
(ii) a plurality of actuators, each actuator being operatively linked to a corresponding tuning tip, for positioning a first of the plurality of tuning tips at a range of distances from the first component and a second of the plurality of tuning tips at a range of distances from the second component, the range being sufficient to cause the resonant frequency of the resonator to vary by at least about 1% of the resonant frequency, the tuning tip being configured and arranged to maintain the Q-factor of the resonator to be at least 10,000.

21. A method of tuning a filter having at least one resonator, the method comprising:
(a) positioning a plurality of tuning tips at a range of distances from the resonator, the resonator having a first component and a second component, the range being sufficient to cause the resonant frequency of the resonator to vary by at least about 1% of the resonant frequency;

(b) tuning the resonator using a plurality of actuators, each actuator being operatively linked to a corresponding tuning tip, for positioning a first of the plurality of tuning tips at a range of distances from the first component and a second of the plurality of tuning tips at a range of distances from the second component; and
(c) maintaining the Q-factor of the filter at not less than 10,000.

22. A tuning assembly for tuning the resonant frequency of a resonator, the resonator comprising a capacitor and an inductor, the tuning assembly comprising:
(a) a plurality of tuning tips, at least one of the tuning tips comprising a superconductor; and
(b) a plurality of actuators, each actuator being operatively linked to a corresponding tuning tip, each actuator being configured to position the corresponding tuning tip over a range of distances from the resonator.

23. The tuning assembly of claim 22, further comprising a varactor corresponding to a tuning tip comprising a superconductor, the varactor being configured to alter the resonant frequency of the resonator over a range of frequencies, wherein the range of frequencies altered by the varactor is smaller than the range of frequency variation caused by the tuning tip.

24. The tuning assembly of claim 22, wherein a first one of the plurality of actuators is configured to position a corresponding tuning tip over a range of distances from the capacitor, and a second one of the plurality of actuators is configured to position its corresponding tuning tip over a range of distances from the inductor, at least one of the tuning tips corresponding to the first and second actuators comprises a superconductor.

25. The tuning assembly of claim 22, wherein at least one of the plurality of the tuning tips is made of a dielectric material.

26. A tuning assembly for tuning a filter, the assembly comprising:
(a) a tuning tip comprising a superconductor; and
(b) an actuator operatively linked to the tuning tip and configured to position the tuning tip at a range of distances from at least a portion of the filter, the range of distances corresponding to a range of bandwidths of the filter.

27. The tuning assembly of claim 26, wherein the range of bandwidths is at least about 10% of the bandwidths.

* * * * *